US010466036B2

(12) United States Patent
Pau

(10) Patent No.: US 10,466,036 B2
(45) Date of Patent: Nov. 5, 2019

(54) ATTACHABLE DEPTH AND ORIENTATION TRACKER DEVICE AND METHOD OF DEPTH AND ORIENTATION TRACKING USING FOCAL PLANE POLARIZATION AND COLOR CAMERA

(71) Applicant: Stanley Pau, Tucson, AZ (US)

(72) Inventor: Stanley Pau, Tucson, AZ (US)

(73) Assignee: Arizona Board of Regents on Behalf of the University of Arizona, Tucson, AZ (US)

( * ) Notice: Subject to any disclaimer, the term of this patent is extended or adjusted under 35 U.S.C. 154(b) by 12 days.

(21) Appl. No.: 15/726,225

(22) Filed: Oct. 5, 2017

(65) Prior Publication Data

US 2018/0100731 A1    Apr. 12, 2018

Related U.S. Application Data

(60) Provisional application No. 62/405,676, filed on Oct. 7, 2016.

(51) Int. Cl.
*G01B 11/14* (2006.01)
*H01L 27/14* (2006.01)
(Continued)

(52) U.S. Cl.
CPC .............. *G01B 11/14* (2013.01); *G01S 7/499* (2013.01); *G01S 17/50* (2013.01); *G01S 17/89* (2013.01);
(Continued)

(58) Field of Classification Search
CPC .... G01B 11/14; G02B 27/286; G02B 5/3016; H04N 13/239; H04N 5/33; H01L 27/14
(Continued)

(56) References Cited

U.S. PATENT DOCUMENTS 5,877,509 A    3/1999  Pau et al.
6,251,546 B1   6/2001  Cirelli et al.
(Continued)

FOREIGN PATENT DOCUMENTS

WO    WO 2017/192663 A1    11/2017

OTHER PUBLICATIONS

Ewing, et al., "Development of a polarization hyperspectral image projector," Proc. SPIE vol. 8364, Polarization: Measurement, Analysis, and Remote Sensing X, Article No. 836408, 11 pages (Jun. 8, 2012).
(Continued)

*Primary Examiner* — Marnie A Matt
(74) *Attorney, Agent, or Firm* — Klarquist Sparkman LLP

(57) ABSTRACT

An imager utilizes a division of focal plane polarization and color camera to measure motion, depth and orientation of objects in a scene in real-time. In various examples, structured light, polarization-controlled discrete reflectors, and/or spatially varying discrete light sources are used to provide light of controlled polarization and color from an object in a scene to a camera. The camera utilizes a pixelated optical filter with a pattern of varying polarization filters across the pixel array, and optionally an integrated color filter pattern. Light measurements are processed to determine polarization state of light received from the object, whence orientation, position, and/or other properties of the object are determined. Systems are operable with a single camera. Applications include virtual reality, gaming, robotics, autonomous vehicles, tele-surgery, industrial automation, 3-D scanning, surveillance, and remote interaction.

24 Claims, 13 Drawing Sheets

(51) Int. Cl.
*H04N 5/33* (2006.01)
*H04N 13/239* (2018.01)
*G02B 27/28* (2006.01)
*G01S 7/499* (2006.01)
*H04N 5/369* (2011.01)
*H04N 9/04* (2006.01)
*G01S 17/50* (2006.01)
*G01S 17/89* (2006.01)
*H04N 13/254* (2018.01)
*G02B 5/30* (2006.01)

(52) U.S. Cl.
CPC ............ *G02B 27/286* (2013.01); *H01L 27/14* (2013.01); *H04N 5/33* (2013.01); *H04N 5/36965* (2018.08); *H04N 9/04553* (2018.08); *H04N 9/04555* (2018.08); *H04N 13/239* (2018.05); *H04N 13/254* (2018.05); *G02B 5/3016* (2013.01)

(58) Field of Classification Search
USPC ......................................................... 348/47
See application file for complete search history.

(56) References Cited

U.S. PATENT DOCUMENTS

| | | | |
|---|---|---|---|
| 6,912,090 | B2 | 6/2005 | Kornblit et al. |
| 7,095,027 | B1* | 8/2006 | Boreman ................. G01J 5/08 250/332 |
| 8,264,536 | B2 | 9/2012 | McEldowney |
| 8,723,118 | B2 | 5/2014 | McEldowney et al. |
| 8,823,848 | B2* | 9/2014 | Chipman ................. G01J 4/04 348/208.2 |
| 8,866,997 | B2 | 10/2014 | Pau et al. |
| 9,671,538 | B2 | 6/2017 | Pau et al. |
| 2004/0041998 | A1* | 3/2004 | Haddad .............. G06K 9/00033 356/71 |
| 2004/0080938 | A1* | 4/2004 | Holman .................... F21S 8/08 362/231 |
| 2007/0075218 | A1 | 4/2007 | Gates et al. |
| 2007/0146473 | A1* | 6/2007 | Masuda .................... B41J 2/471 347/246 |
| 2010/0184563 | A1* | 7/2010 | Molyneux ............ A43B 1/0054 482/1 |
| 2011/0069189 | A1 | 3/2011 | Venkataraman et al. |
| 2012/0075513 | A1* | 3/2012 | Chipman .................. G01J 4/04 348/302 |
| 2012/0265184 | A1* | 10/2012 | Sliwa .................... A61B 5/0084 606/15 |
| 2012/0281072 | A1 | 11/2012 | Georgiev et al. |
| 2013/0076910 | A1 | 3/2013 | Scott |
| 2013/0206967 | A1* | 8/2013 | Shpunt .................... G06T 15/00 250/216 |
| 2013/0265485 | A1 | 10/2013 | Kang |
| 2016/0170110 | A1 | 6/2016 | Pau et al. |
| 2016/0233045 | A1 | 8/2016 | Hua et al. |
| 2016/0245698 | A1 | 8/2016 | Pau et al. |
| 2016/0267348 | A1* | 9/2016 | Kondo ................. G06K 9/2036 |
| 2016/0282639 | A1* | 9/2016 | von und zu Liechtenstein .......... G01J 4/00 |

OTHER PUBLICATIONS

Garcia, et al., "Surface normal reconstruction using circularly polarized light," Optics Express 14391, vol. 23, No. 11, 16 pages (Jun. 1, 2015).
Geng, "Structural-light 3D surface imaging: a tutorial," Advances in Optics and Photonics, vol. 3, pp. 128-160 (2011).
Hsu, et al., "Full-Stokes imaging polarimeter using an array of elliptical polarizer," Optics Express 3063, vol. 22, No. 3, 12 pages (Feb. 10, 2014).
Tu, et al., "Optimized design of N optical filters for color and polarization imaging," Optics Express 3011, vol. 24, No. 3, 14 pages (Feb. 8, 2016).
Yuffa, et al., "Three-dimensional facial recognition using passive long-wavelength infrared polarimetric imaging," Applied Optics, vol. 53, No. 36: pp. 8514-8521 (Dec. 20, 2014).
International Search Report and Written Opinion of International Application No. PCT/US2017/030752, dated Sep. 1, 2017, 9 pages.
Tu et al. "Optimized design of N optical filters for color and polarization imaging." *Optics Express* 24, No. 3, pp. 3011-3024 (Feb. 5, 2016).

\* cited by examiner

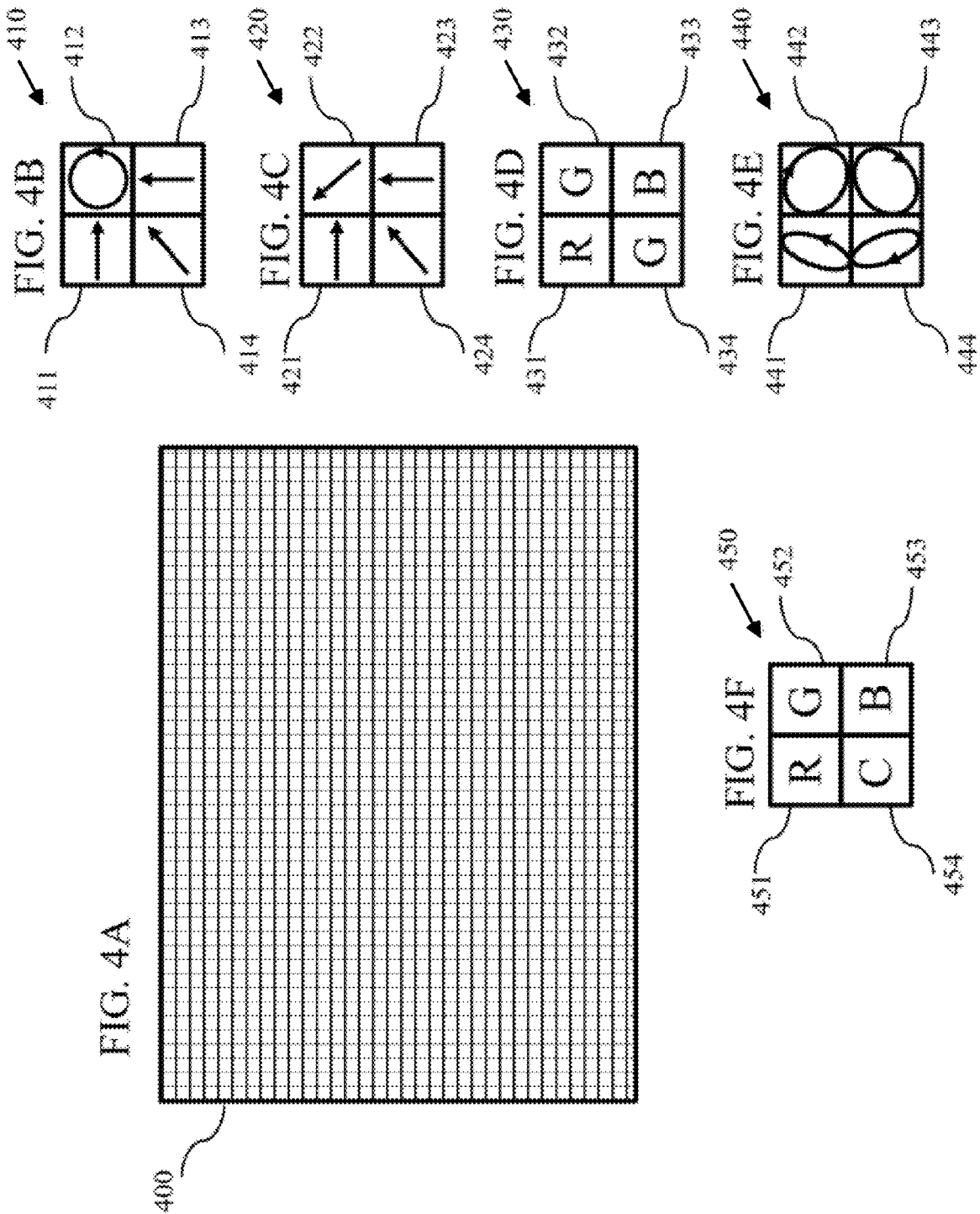

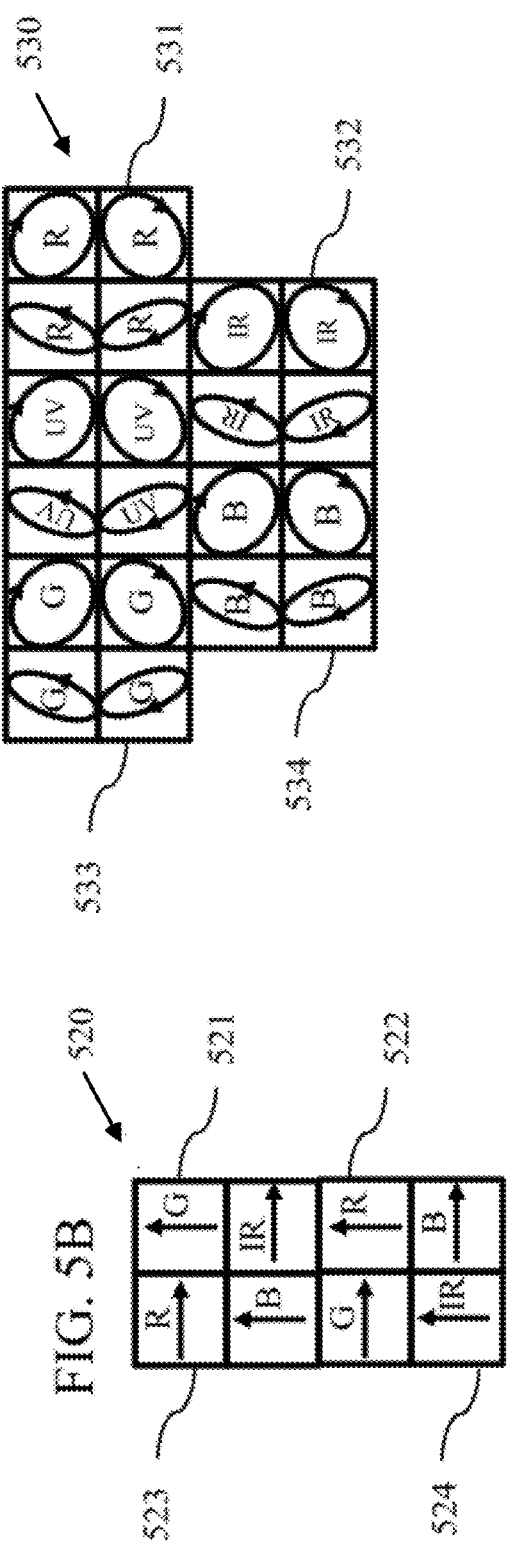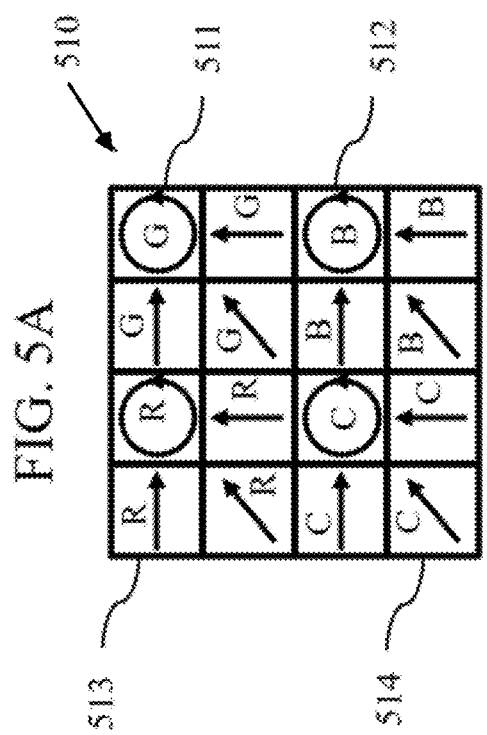

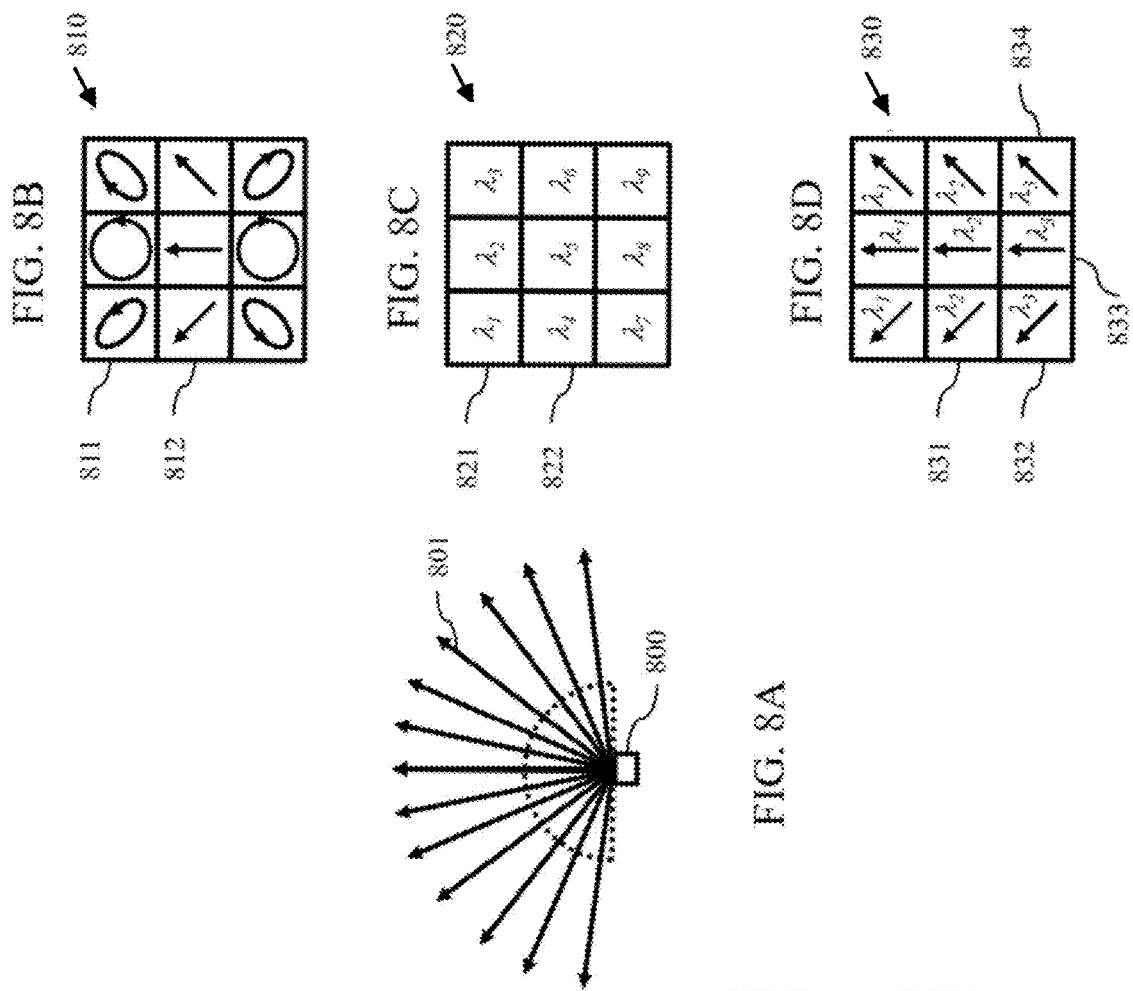

ATTACHABLE DEPTH AND ORIENTATION TRACKER DEVICE AND METHOD OF DEPTH AND ORIENTATION TRACKING USING FOCAL PLANE POLARIZATION AND COLOR CAMERA

CROSS-REFERENCE TO RELATED APPLICATIONS

This application claims the benefit of U.S. Provisional Application No. 62/405,676, entitled "DEPTH AND ORIENTATION TRACKER USING DIVISION OF FOCAL PLANE POLARIZATION AND COLOR CAMERA," filed Oct. 7, 2016, which is incorporated by reference herein in its entirety.

BACKGROUND

For many applications, such as remote sensing, surveillance, three-dimensional (3D) scanning/imaging, industrial inspection, metrology, medical imaging, biometrics authentication, object tracking, virtual reality and augmented reality, it may be desirable to have a compact, high resolution, portable, and fast tracker to accurately measure, in real time, the movement and location of an object. Such an imager should consume low power and be insensitive to vibration.

Devices using a rotating color wheel are generally sensitive to vibration. Other systems employ scanning polarizers and suffer from motion blur. Other systems utilize a microlens array and coded apertures. Such complex systems reduce the amount of light available for image detection, and therefore reduce the signal-to-noise ratio (SNR). The final image resolution can also be reduced considerably. Thus, the measurement of additional information using this apparatus, such as light direction of the light field, is made at the expense of reduced SNR and image resolution. Complex systems also have increased computational burden for image processing.

SUMMARY

Methods and apparatus are disclosed for tracking objects using a division of focal plane camera having varying polarization sensitive elements and optionally varying wavelength sensitive elements.

In certain examples, the disclosed technology is in the form of a system having one or more attachable devices, one or more light sensors, and one or more computers. Each attachable device can incorporate one or more polarization-controlled components, which can be light-emitting elements. Each light sensor can incorporate a focal plane array which is polarization sensitive and wavelength sensitive. The computers can be connected to the light sensor(s).

In some examples where the polarization-controlled components incorporate light-emissive components, one or more of the light-emissive elements can have uniform polarization for all angles of emission, while in other examples, light-emissive components can have polarization that varies over angles of emission. In further examples, the light-emitting components can incorporate a spatially varying optical filter. The light-emitting components can emit light at one or more wavelengths, including a wavelength that is in the infrared or ultraviolet portions of the electromagnetic spectrum.

In additional examples, the system can include a wearable item to which one or more attachable devices are affixed. As non-limiting examples, such wearable items can include one or more of: goggles, a helmet, a visor, a headband, a glove, a vest, a jacket, a wristband, an armband, an anklet, a legging, footwear, or an adhesive tag. The system can generate and store a record of the orientation of attachable devices based on based on light received by the light sensors from the attachable devices.

In varying examples, the disclosed system can be configured for a wide range of applications. Particularly, the system can be configured to provide one or more of: a virtual reality or augmented reality display, user input in a gaming environment, remote control of a machine or instrument, navigation of an autonomous vehicle, control of directional movement of an object, surveillance information, telesurgery visualization, an interactive leisure or social activity, interactive sports or athletics, or interactive training.

In further examples, the disclosed technology is in the form of an apparatus for providing virtual interactivity. First and second systems at respective locations can generate position and/or orientation of one or more objects at their respective locations (each location can have a finite extent, such as a room, a building, a campus, a vehicle, a road, a playing field, an arena, or an open space), wherein each detected object is attached to one or more of the attachable devices. The apparatus can further include first and second displays at the locations of the first and second systems, each configured to display objects at the other location.

In examples, this apparatus can include one, two, several, or many additional instances of the disclosed system configured to generate position and/or orientation information of objects attached to attachable devices at the respective locations of the additional systems; the first display can further display the objects at these additional system locations.

In certain examples, the disclosed technology is in the form of a method. A system as described above or elsewhere in this disclosure is provided, comprising one or more light sensors. At the light sensors, polarization-controlled light propagating from one or more attachable devices is detected. At one or more computers, an analysis procedure is performed on the detected light to determine one or more properties of the attachable devices. In varying examples, the determined properties can include one or more of: position, orientation, direction of a surface normal, speed, velocity, color, reflectance, refractive index, or bidirectional reflectance distribution.

In some examples, the analysis procedure can include a physics-based procedure, using e.g. Fresnel equations or a Mueller matrix formalism. The method can further include generating a virtual reality or augmented reality display based on determined position and orientation of attachable devices.

In certain examples, the disclosed technology is in the form of a system having one or more attachable devices, one or more structured illumination sources, one or more light sensors, and one or more computers. Each attachable device can incorporate one or more polarization-controlled components, which can be reflective elements. The structured illumination sources can be configured, singly or collectively, to illuminate the one or more attachable devices with light having polarization structure and color structure. Each light sensor can incorporate a focal plane array which is polarization sensitive and wavelength sensitive. The computers can be connected to the light sensor(s). In some examples, the system can include computers connected to and controlling the structured illumination sources.

In additional examples, the disclosed technology is in the form of a light sensor having a polarization sensitive focal plane array of repeating pixels, each pixel having a block of subpixels with at least a first subpixel and a second subpixel. The first subpixel includes a first polarization filter configured to transmit light of a first state of polarization and to substantially block light of a second state of polarization orthogonal to the first state. The second subpixel includes a second polarization filter configured to transmit light of a third state of polarization (different from the first state of polarization) and to substantially block light of a fourth state of polarization orthogonal to the third state. The light sensor can include second repeating pixels, each second pixel having a cluster of subpixels. Two of the cluster subpixels have respective wavelength filters configured to selectively transmit different first and second wavelengths respectively; accordingly, these subpixels transmit the first and second wavelengths respectively.

In some examples, one or more of the block subpixels can incorporate a liquid crystal polymer retarder. Some polarization filters can include a wire grid polarizer, a liquid crystal polymer polarizer, or a dichroic material.

In additional examples, the disclosed technology is in the form of a camera incorporating one or more of the disclosed light sensors. In further examples, the disclosed technology is in the form of a system incorporating one or more disclosed cameras, one or more structured illumination sources, and one or more computers connected to the cameras. At least one computer can be configured to apply an analysis procedure to data obtained from the one or more cameras to determine one or more properties of one or more test objects illuminated by the structured illumination. In certain examples, at least one of the the structured illumination sources provides illumination having both polarization structure and color structure.

In further examples, the disclosed technology includes an imager that utilizes a division of focal plane polarization and color camera to measure motion, depth and orientation of objects in a scene in real-time with frame rate limited by the acquisition speed of the focal plane array and image processing time. In some examples of the disclosed technology, a system includes (1) a polarization and color structured illuminator, (2) a polarization and color camera, (3) a computer controller connecting to the illuminator and the camera, either by wire or by wireless connection, and (4) a set of reflectors or light emitters placed on objects that are being tracked. The system or subsystem may contain its own power supply, such as a battery. The usage of reflectors or emitters can improve the accuracy of the measurement. In some examples, there may be more than one structured illuminator to illuminate the scene at different perspectives and distances. In other examples, there can be more than one polarization and color camera to detect the scene at different perspectives and distances. Multiple cameras and illuminators can provide stereoscopic views of the scenes, which can facilitate the 3D reconstruction. The system design can be modified to suit the requirements of a particular application.

In some examples, a tracking system utilizes a polarization and color sensitive camera or sensor to track the motion of an object that has an attachable device. The attachable device either emits or reflects light of specific and different colors and/or polarizations. In some examples, the object can be illuminated with structural illuminations of varying color and polarization. Real time measurement of the polarizations and colors received from the object and the attachable device provides information on the motions, orientations, and locations of the object and subzones of the object, or of multiple objects. For example, if the object is a person that is playing basketball, one type of polarized device could be attached to the person's elbow and another type of device with a different polarization could be attached to the person's hand. The camera would thus be able to distinguish the motion of the elbow from the motion of the hand and track both simultaneously.

In some applications, such an imager may be mounted in a self-driving car or in a drone.

Innovative methods can be implemented as part of one or more computing systems adapted to perform an innovative method, or as part of non-transitory computer-readable media storing computer-executable instructions for causing a computing system to perform the innovative method(s). The various innovations can be used in combination or separately. The foregoing and other objects, features, and advantages of the invention will become more apparent from the following detailed description, which proceeds with reference to the accompanying figures.

BRIEF DESCRIPTION OF THE DRAWINGS

FIG. 4A is a schematic diagram of a focal plane array 400 made up of an array of pixels.

FIG. 4B depicts a set of four optical filters 410 for four subpixels.

FIG. 4C depicts a set of four optical filters 420 for four subpixels.

FIG. 4D depicts a set of four optical filters 430 for four pixels or four subpixels.

FIG. 4E depicts a set of four optical filters 440.

FIG. 4F depicts a set of four optical filters 450.

FIG. 5A depicts a set of sixteen optical filters 510 for tiling on top of an array of pixels.

FIG. 5B depicts a set of eight optical filters 520 for tiling on top of an array of pixels.

FIG. 5C depicts a set of twenty optical filters 530 for tiling on top of an array of pixels.

FIG. 8A depicts a light source emitting light over a steradians.

FIG. 8B depicts the polarization state of an exemplary light source at different angular positions.

FIG. 8C depicts the wavelength of an exemplary light source at different angular positions.

FIG. 8D depicts the polarization state and wavelength of an exemplary light source at different angular positions.

FIG. 8E is a map of light directions have different polarization eccentricity and angle over a steradians.

FIG. 8F is a map of light directions have different wavelength and polarization angle covering $2\pi$ steradians.

DETAILED DESCRIPTION

This disclosure is set forth in the context of representative embodiments that are not intended to be limiting in any way.

I. Structured Illuminator Combining Polarization and Color

A structured light source can be constructed using a projector or a laser scanner. A predetermined set of patterns, such as random or pseudorandom codifications, binary structured codifications, or grey scale n-ary codifications, can be projected onto a scene and the reflection and/or scattered light from the projection of the scenes is measured. A computer can be used to control the projector or laser scanner to display different patterns as a function of time. In various examples, the intensity, color, polarization, coherence, and/or spatial/temporal profile of the structured light source can be controlled to maximize signal-to-noise ratio in the image acquisition.

Figure 1:
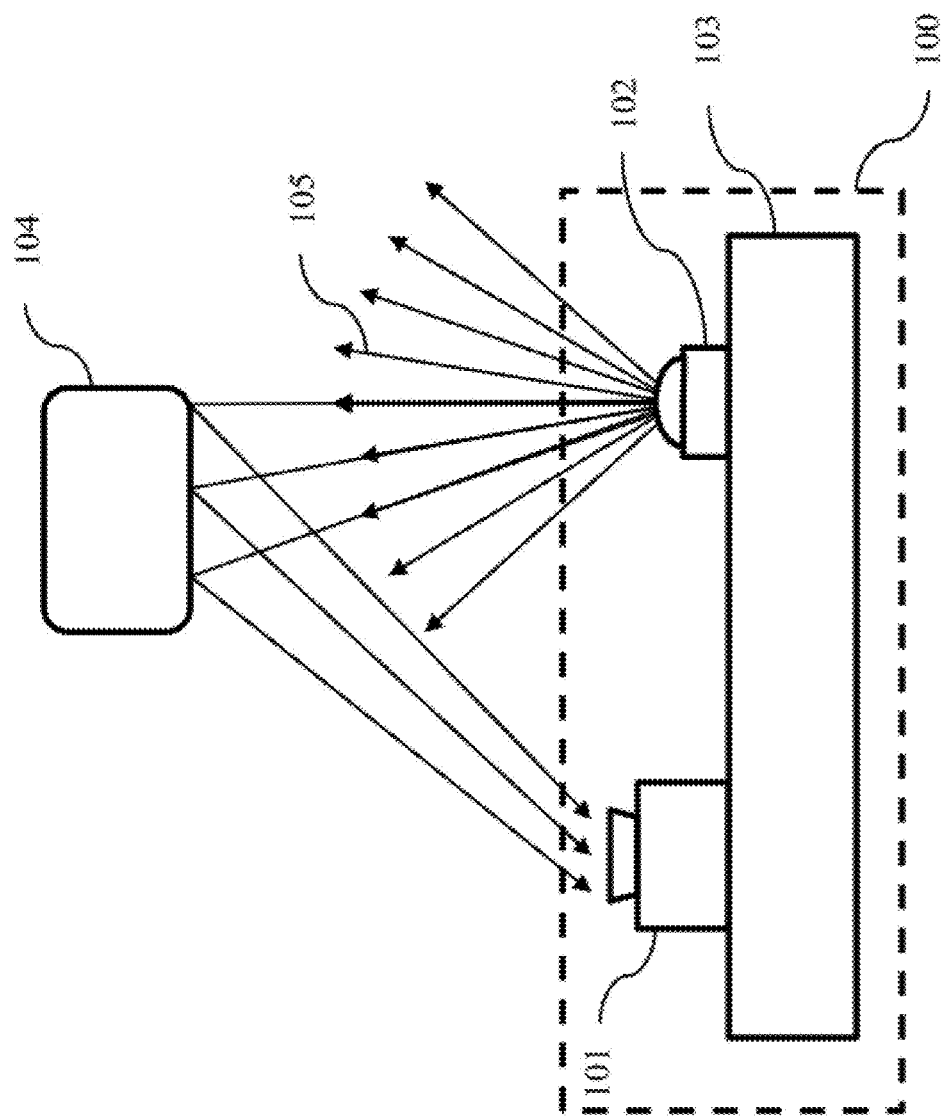
FIG. 1 is a schematic diagram of a depth imager 100 according to the disclosed technologies.

FIG. 1 is a schematic diagram of an exemplary depth imager 100, consisting of a color and polarization camera 101, a structured illuminator 102, and controlling electronics 103. Light rays 105 are emitted from the illuminator 102 and are reflected from an object 104 and are detected by the camera 101. In some examples, camera 101 comprises a focusing lens or lens group, a focal plane imaging sensor array (such as a polarization sensitive focal plane array), a housing, and control electronics. In other embodiments, such as those described in context of FIGS. 7-10 and 12, object 104 can be a light-emitter; in such embodiments illuminator 102 can be omitted. In some embodiments the control electronics of camera 101 can comprise a computer, or camera 101 can be coupled to a computer (not shown).

Figure 2:
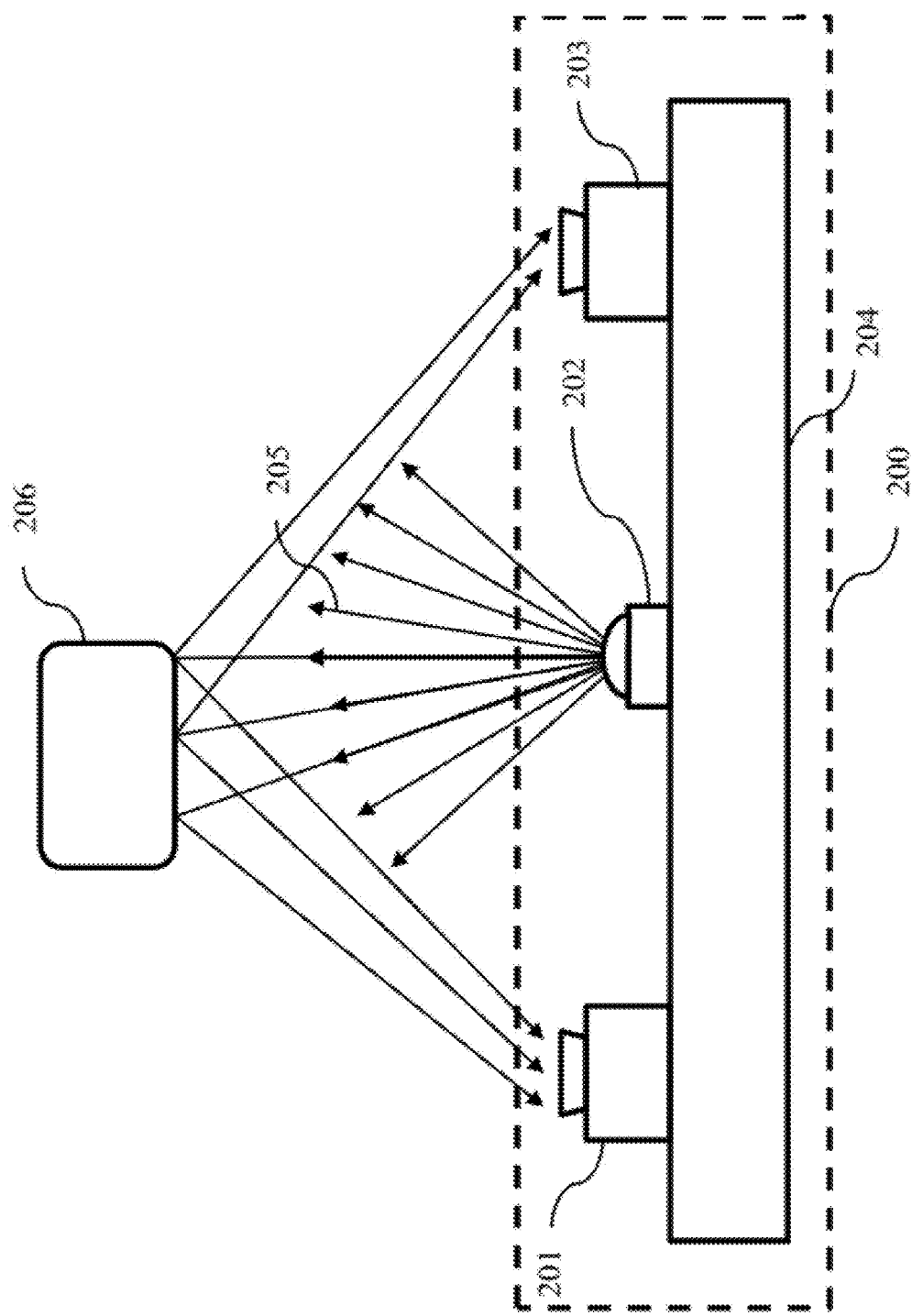
FIG. 2 is a schematic diagram of a depth imager 200 according to the disclosed technologies.

FIG. 2 is a schematic diagram of a depth imager 200 according to the disclosed technologies, consisting of two color and polarization cameras 201 and 203, a structured illuminator 202 and controlling electronics 204. Light rays 205 are emitted from the illuminator 202 and are reflected from an object 206 and are detected by the two camera 201 and 203 at different perspectives.

Figure 3A:
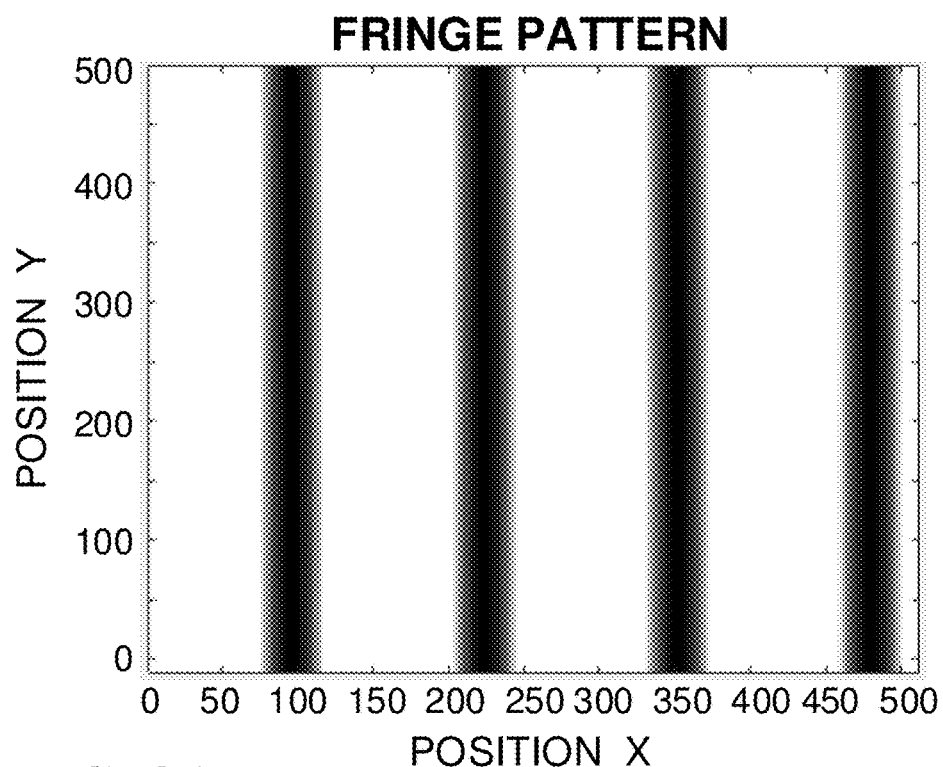
FIG. 3A depicts a periodic fringe pattern with varying intensity.
Figure 3B:
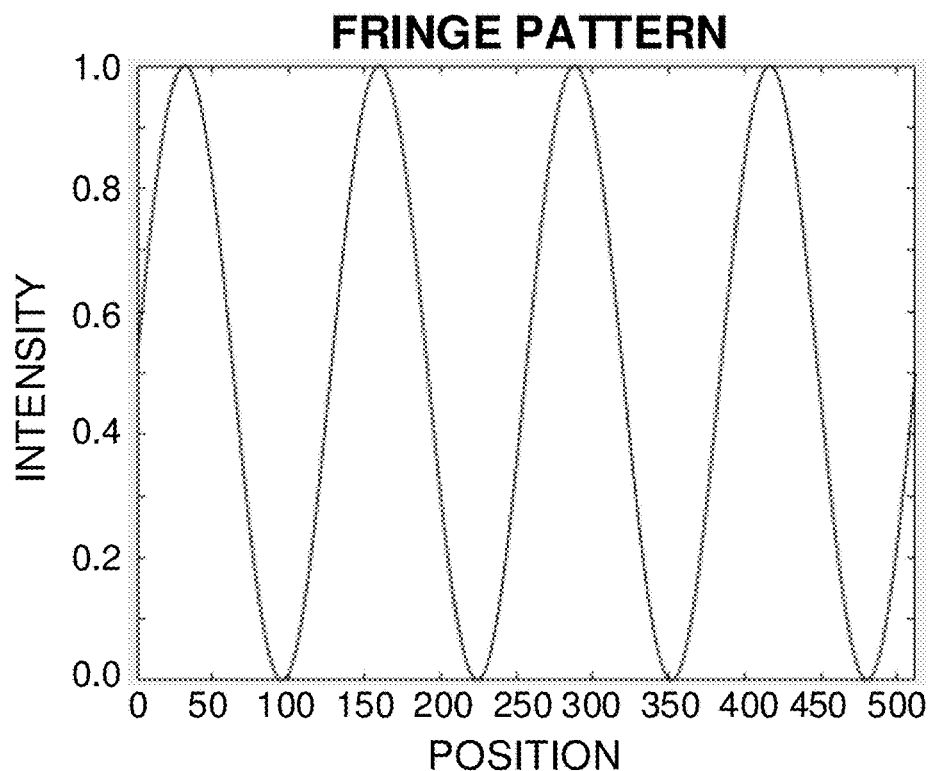
FIG. 3B depicts a plot of intensity of light as a function of position.
Figure 3C:
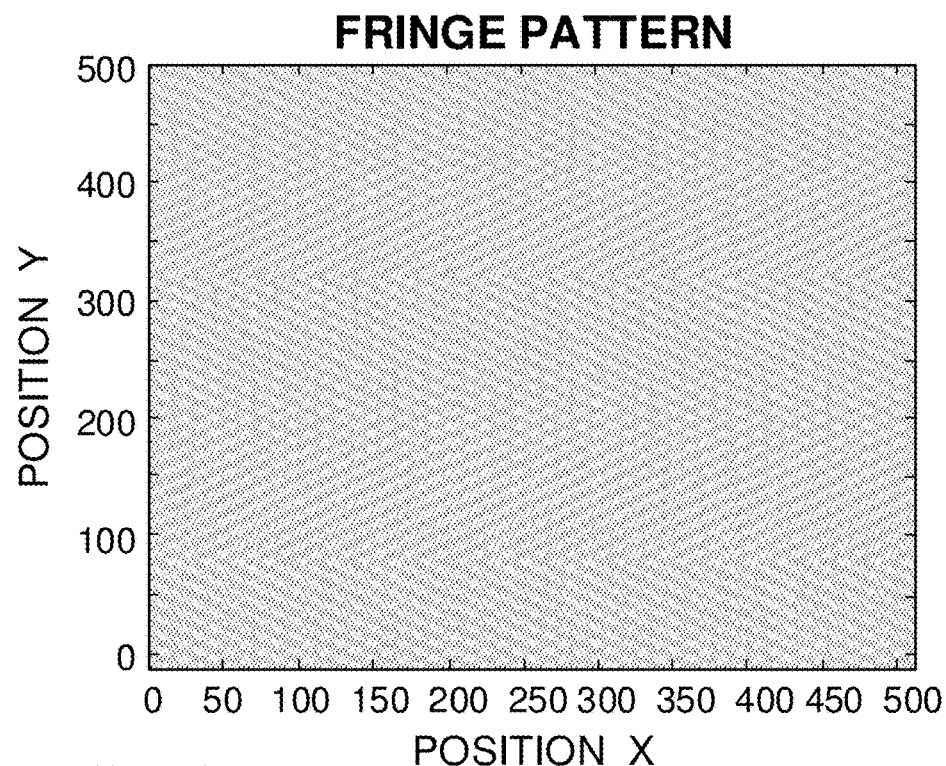
FIG. 3C depicts a pattern with uniform intensity.
Figure 3D:
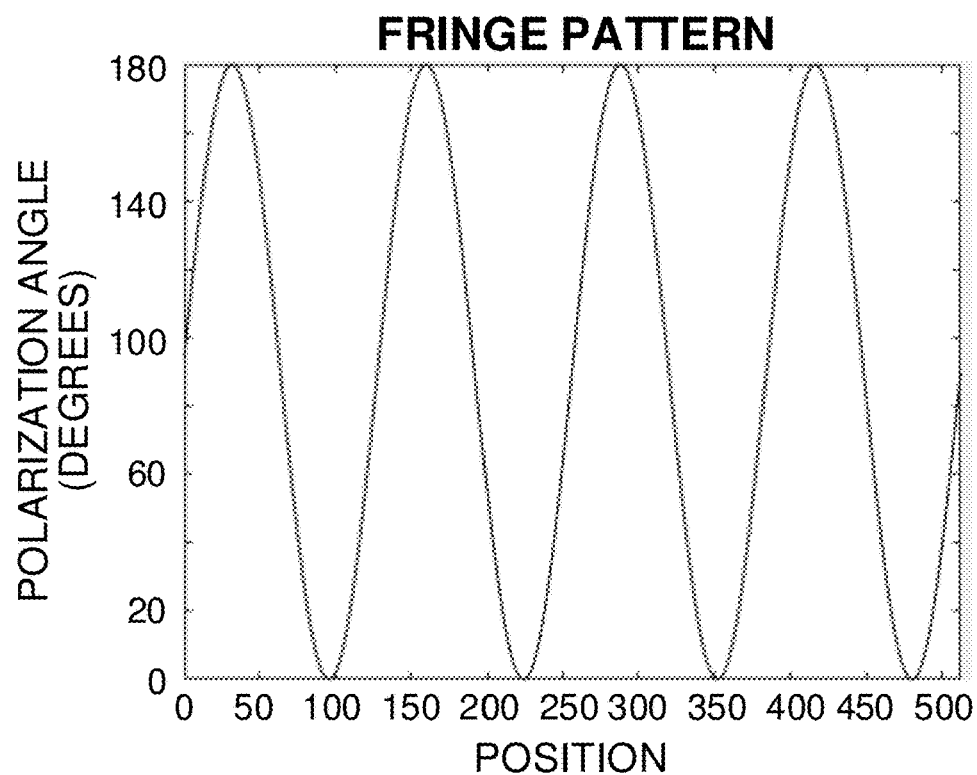
FIG. 3D depicts a plot of polarization angle of light as a function of position.

The information of the patterns can be coded in colors, such as a set of sinusoidal fringes in white, red, green or blue intensity (FIG. 3A and FIG. 3B), or in polarization states, such as a set of uniform illumination of a single color with each pixel at a different polarization (FIG. 3C and FIG. 3D), or in a combination of colors and polarization states. FIG. 3A depicts a periodic fringe pattern with varying intensity. FIG. 3B depicts a plot of intensity of light as a function of position corresponding to the fringe pattern of FIG. 3A. FIG. 3C depicts a pattern with uniform intensity (the stipple shading represents uniform gray in the drawing), which shows no apparent fringes. FIG. 3D depicts a plot of polarization angle of light as a function of position, for an example in which the intensity pattern is shown in FIG. 3C.

Examples of polarization state include linear, circular, and elliptical polarization. The wavelength of the projection is not limited to visible light and can be ultraviolet or infrared light. For some applications, it may be desirable to use light that is not visible to the human eye. A polarization hyperspectral image projector has been developed by Boulder Nonlinear Systems, Inc. (Colorado, USA) and can be utilized as a structured light source in examples of the disclosed technologies. In such a projector, a spatial light modulator can be utilized to control the intensity of light for each color, and two variable retarders are utilized to control the polarization state of light for each color. For example, a three color polarization image projector will need three spatial light modulators and six variable retarders to control the color and polarization states. In general, increasing the number of colors in the structured illumination increases the SNR and accuracy of the measurement.

As used in this disclosure, the term "color" refers to an electromagnetic spectral profile. The profile can be an emission profile, for example from a structured light source, a discrete light source, or another light source. The profile can be a transmission profile, for example through an optical filter, a color filter, or another optical component. The profile can be a detection profile, for example from a light detecting component with or without a color filter. Two colors are considered different if they can be distinguished by a color-sensitive camera used in certain examples of the disclosed technology. In certain examples, a color-sensitive camera can distinguish two colors that cannot be distinguished by an average human observer. In certain examples, a color-sensitive camera cannot distinguish two colors that can be distinguished by an average human observer. Suitable colors can include visible light colors, and include merely as examples such common colors as red, green, blue, magenta, cyan, yellow, and white. Colors need not be visible, however, and can include one or more colors in the infrared or ultraviolet portions of the electromagnetic spectrum. In analogous fashion, the term "light" refers to electromagnetic radiation at wavelengths (in air or vacuum) between about 100 nm and 10 µm, and sometimes between about 350 nm and 2.2 µm. Examples based on available laser diode sources can be associated with wavelengths of between about 800 nm and 1700 nm. Particularly, light need not be at visible wavelengths, and can be infrared light or ultraviolet light.

II. Color and Polarization Camera

A division of focal plane camera utilizes different micro-optical filter on each pixel or subpixel of a focal plane array to detect light of different color and polarization, as shown in FIG. 4. Focal plane polarization color cameras can be divided into several classes, for example: broadband vs. narrowband, and linear polarization vs. full Stokes polarization.

For a broadband camera, the detector is sensitive to light from ultraviolet, through visible, to near infrared spectrum, with ranges determined by the absorption sensitivity of the focal plane array. In certain examples, individual subpixel photosites of a camera sensor array can be silicon-based (e.g., a charge-coupled device (CCD) or complementary oxide metal semiconductor (CMOS) sensor integrated circuit). The image acquired by a broadband camera is monochrome. For a narrowband camera, such as a camera with a Bayer color filter array, the camera's sensor photosites are sensitive to particular or respective ranges of wavelengths. In certain examples, the sensed wavelength ranges may correspond to common colors such as red, green, or blue.

The image acquired by a camera with Bayer color filter is colorful and mimics the view seen by the human visual system.

For a linear polarization camera, the detector is sensitive to light of linear polarization states. In certain examples, this is accomplished by using a pixelated linear micro-polarizer, in which each pixel or subpixel can have sensitivity to a corresponding linear polarization state. For a camera with only one orientation micropolarizer, the camera is only sensitive to that linear polarization. For a camera with a micropolarizer having pixels or subpixels of two different orientations, the camera is sensitive to both the two linear polarization states. In a common example of a linear polarization camera, there can be linear micropolarizers of four orientations at 0, 45, 90 or 135 degree, which allows the measurement of the first three components of the Stokes vector, S0, S1 and S2. The image acquired by such a camera describes the linear polarization states of a scene. The linear micropolarizer can be a wire grid polarizer, a liquid crystal polymer polarizer using dichroic dyes, or other technologies, and combinations thereof.

As will be readily apparent to one of ordinary skill in the art, a polarization filter that transmits a particular polarization state is understood to substantially block light of an orthogonal polarization state. For example, a linear polarization filter that transmits 0°-oriented linearly polarized light can substantially block light of 90°-oriented linear polarization. A polarization filter that transmits right-circularly polarized light can substantially block left circularly polarized light. Because light of one polarization state can be resolved into components of light of two or more different polarization states, a polarization filter for, say, 45°-oriented light can detect linearly polarized light having 0°- or 90°-oriented linear polarization, or even right-circular polarization, albeit with reduced sensitivity, but will substantially block 135°-oriented linearly polarized light, which is orthogonal to 45°. An optical component such as a polarization filter or a color filter is said to "transmit" a certain kind of light when the certain kind of light entering one surface of the optical component results in substantially the same kind of light exiting another surface of the optical component. Light that is not transmitted is said to be blocked, and may be reflected or absorbed. If two parallel electromagnetic waves of substantially the same frequency and having respective polarization states and respective electric field vectors are such that the vector dot product of the electric field vectors, averaged over one period, is substantially zero for any temporal phase shift between the two waves, then the two polarization states are said to be "orthogonal". In some examples, the blocked polarization state may have transmission through the filter that is less than 0.01%, or 0.1%, or 1%, or 2%, or 5%, or 10%, or 20%, or even 30%.

For a full Stokes polarization camera, the detector is sensitive to light of linear, circular, and elliptical polarization states. This can be accomplished by using a pixelated linear, circular, and/or elliptical polarizer. A set of four elliptical polarizers can be utilized to measure the complete Stokes vector, S0, S1, S2 and S3.

The Stokes vector can be estimated by a minimum of four intensity measurements of light passing through different polarizers. Higher accuracy can be achieved by additional measurements. In one example of a division of focal plane polarimeter, a pixelated retarder and a linear polarizer are placed in front of the sensor array. A minimum of four types of micro-retarder are used, oriented at four different angles, to measure the Stokes vector locally. The Stokes vector at each pixel is calculated by using interpolated values of intensity measurement taken at adjacent pixels. The fast-axis orientation angles of the retarder are optimized for the number of measurements used.

The image acquired by such a camera describes the full polarization states of a scene. The elliptical micropolarizer can be made of a layer of linear polarizer and a layer of retarder. In some examples, the linear polarizer can be a wire grid polarizer, a liquid crystal polymer polarizer using dichroic dyes, or other technologies, or combinations thereof In some examples, the retarder can incorporate a liquid crystal polymer.

FIG. 4A is a schematic of a polarization sensitive focal plane array 400 made up of an array of pixels and subpixels. Each block or cluster of four subpixels in 400 is covered by a set of four optical filters. FIG. 4B depicts an exemplary set of four optical filters 410 for four subpixels. These optical filters can be a linear polarizer at 0° 411, a right circular polarizer 412, a linear polarizer at 90° 413, and a linear polarizer at 45° 414. FIG. 4C depicts another exemplary set of four optical filters 420, which can be a linear polarizer at 0° 421, a linear polarizer at 135° 422, a linear polarizer at 90°423, and a linear polarizer at 45° 424. FIG. 4D depicts a set of four optical filters 430, which can be a red color filter 431, a green color filter 432, a blue color filter 433, and a green color filter 434. In various examples, the relative angles of linear polarizer angles can vary from the nominal values of 45°, 90°, or 135° by as much as 0.1°, as much as 0.2°, as much as 0.5°, as much as 1.0°, as much as 2.0°, as much as 5.0°, or as much as 10°. FIG. 4E depicts a set of four optical filters 440, which can be achromatic elliptical polarizers. Each elliptical polarizer is made of a vertical polarizer and a retarder of retardance of 132°. Retarder 441 has a fast angle at +15.1°, retarder 442 has a fast angle at +51.7°, retarder 443 has a fast angle at −51.7°, and retarder 444 has a fast angle at −15.1°. FIG. 4F depicts a set of four optical filters 450, which can be a red color filter 451, a green color filter 452, a blue color filter 453, and a clear (sometimes dubbed white) color filter 454. In various examples, the retarder angles can vary from the nominal values of ±15.1°, ±51.7°, or ±132° by as much as 0.1°, as much as 0.2°, as much as 0.5°, as much as 1.0°, as much as 2.0°, as much as 5.0°, or as much as 10°.

The disclosed technologies can be implemented with all combinations of color and polarization camera. FIG. 5A depicts an exemplary set of sixteen optical filters 510 that can be tiled on top of an array of pixels or subpixels. The optical filters are color polarizers. Reference numeral 511 denotes a green right circular polarizer. Reference numeral 512 denotes a blue right circular polarizer. Reference numeral 513 denotes a red linear polarizer at 0°. Reference numeral 514 denotes a clear linear polarizer at 45°. This example can be viewed as a cluster of four blocks or pixels (respectively red, green, clear, and blue), each block or pixel being made up of four subpixels having respectively three linear polarization filters and one circular polarization filter. FIG. 5B depicts an exemplary set of eight optical filters 520 which can be tiled on top of an array of pixels or subpixels. The optical filters can be broadband or color polarizers. Reference numeral 521 denotes a green linear polarizer at 90°. Reference numeral 522 denotes a red linear polarizer at 90°. 523 denotes a red linear polarizer at 0°. Reference numeral 524 denotes an infrared linear polarizer at 90°. This example can be viewed as two blocks of 2×2 subpixels each. The polarization filter pattern is the same for each block, while the color filter pattern is rotated clockwise 90° going from the top block to the bottom block. FIG. 5C depicts a set of twenty optical filters 530 which can be tiled on top of an array of pixels or subpixels. The optical filters can be broadband or color polarizers. Reference numeral 531 denotes a red elliptical polarizer. Reference numeral 532 denotes an infrared elliptical polarizer. Reference numeral 533 denotes a green elliptical polarizer. Reference numeral 534 denotes a blue elliptical polarizer. This example can be viewed as a cluster of five blocks or pixels (respectively green, ultraviolet, red, blue, and infrared), each of which contains four subpixels having a repeating pattern of elliptic polarization filters. In this example, the blocks or pixels on the top row are offset by one subpixel horizontally from the blocks or pixels on the bottom row.

Some examples of division of focal plane color and polarization camera are (a) a broadband linear polarization camera, (b) a narrowband red and green full Stokes polarization camera, and (c) an infrared full Stokes polarization camera. Other suitable cameras can be used. Some applications may measure only linear polarization state in one color, while other applications may measure arbitrary polarization state in three or more colors.

In an example, camera 101 may incorporate a light sensor comprising polarization sensitive division of focal plane array 400. Each small square in FIG. 4A can be understood to be a subpixel. In the example, a repeating block of four subpixels can be covered with a corresponding of 2×2 array 410 of polarization filters 411-414 as shown in FIG. 4B. Reference numeral 411 denotes a linear polarization filter for covering one subpixel and transmitting linearly polarized light oriented at 0° (for example, with electric field aligned with the arrow of polarization filter 411) and substantially blocking linearly polarized light oriented at 90° (for example, with electric field aligned perpendicular to the arrow of polarization filter 411). Reference numeral 412 denotes a linear polarization filter transmitting left-circularly polarized light and substantially blocking right-circularly polarized light, which is orthogonal to left-circularly polarized light.

In other examples, a 2×2 array of subpixels can be covered with corresponding arrays of polarization filters according to FIG. 4C or 4E; many other combinations and arrangements or polarization filters can also be used. Furthermore, repeating blocks of subpixels can be of different shapes and sizes, and can include two subpixels, three subpixels, four subpixels, five subpixels, six subpixels, seven subpixels, eight subpixels, or even more subpixels. Additionally, repeating blocks of subpixels having one pattern of polarization filters can be interspersed with other blocks of subpixels having another pattern or patterns of polarization filters, or blocks of subpixels having no polarization filters.

In some examples, the focal plane array can further comprise repeating arrays of color filters covering clusters of subpixels. FIG. 5B shows a cluster of eight subpixels 520 having red (R), green (G), blue (B), and infrared (IR) filters over two blocks of four subpixels having linearly polarized polarization filters as indicated by respective arrows in the subpixels. In this example, the subpixels of the cluster coincide with the subpixels of the blocks, but this is not a requirement. FIGS. 5A and 5C show example configurations where the color filter subpixels each correspond to four polarization filter subpixels. For example, the red (R) color filter shown in FIG. 5A comprises a block of four polarization filter subpixels. FIG. 5C shows a different configuration in which a repeating cluster of five color filter subpixels (green, ultraviolet, and red in the top row; blue and infrared in the bottom row) overlays an array of twenty polarization filter subpixels. In other examples, the polarization filter subpixels can be larger than the color filter subpixels.

III. Computer Control of Illumination and Camera

In certain examples, a computer controls the illuminator. In certain examples, a computer (which can be the same or a different computer) controls the camera.

IV. 3D Reconstruction Algorithms

Figure 6:
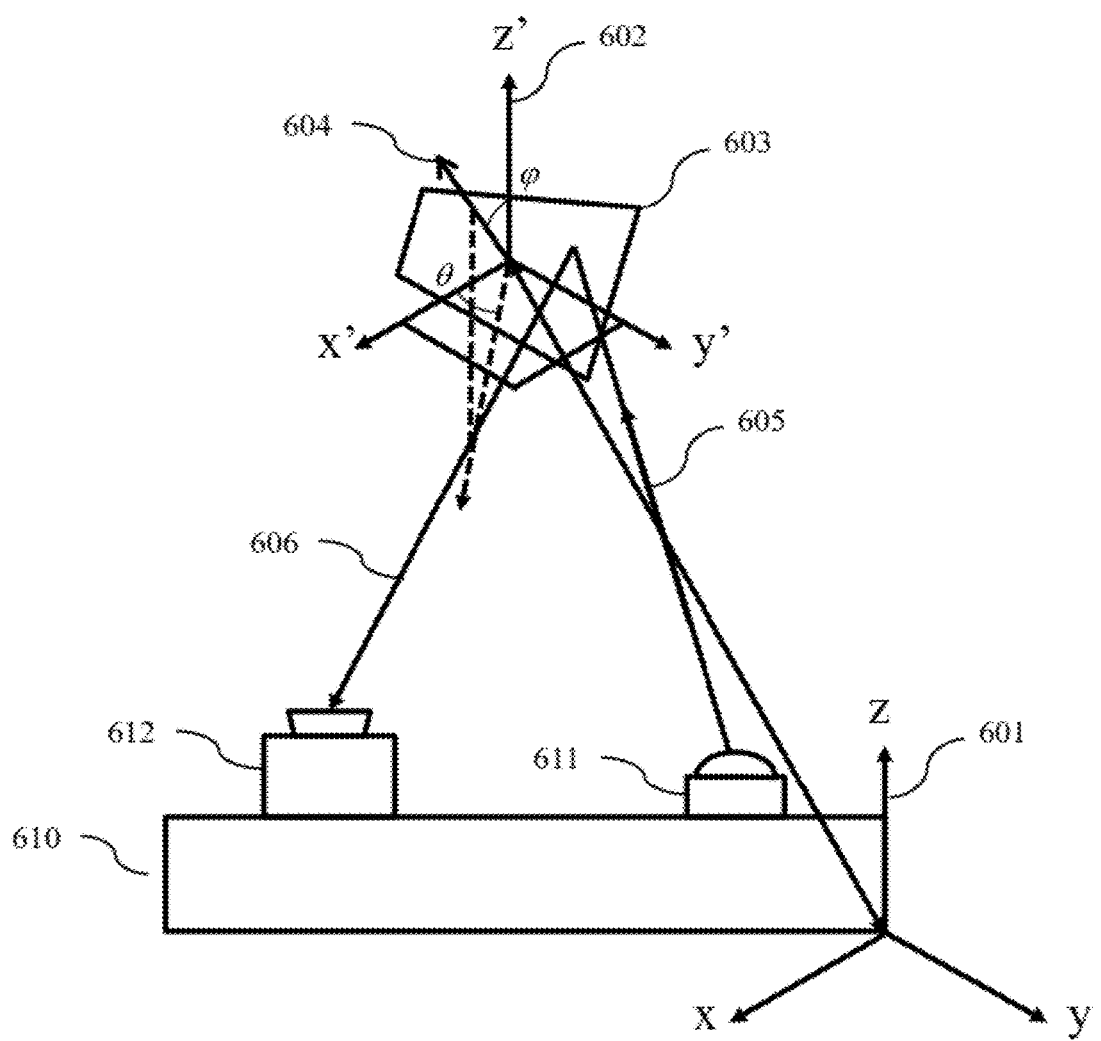
FIG. 6 is a schematic diagram of an imaging system and an object.

A computer can be used to calculate the structure of a scene using one or more 3D reconstruction algorithms. The color and polarization camera measures the color and polarized light scattered from a scene illuminated by structured illumination. Depending on the complexity of the scene, the illumination can be uniform or non-uniform. In FIG. 6, an imager 610 is utilized to measure the location and surface normal 604 of a plane 603, representing part of an object in a scene. The location of the imager is described by Cartesian coordinate system 601. The orientation of the surface normal 604 of the object is described by coordinate system 602. A light ray 605 of a specific color and polarization state is emitted from an illuminator 611 to illuminate the object and plane 603. The ray 606 represents light reflected and/or scattered from the plane 603, and can have a different intensity and polarization state and is measured by a color and polarization camera 612, as compared to ray 605. The information regarding the change in intensity and polarization state can be determined from the light measured at camera 612 and can be utilized to calculate the location and surface normal of objects in the scene. A 3D representation of the scene can be constructed once the depth and surface normal of the objects are determined.

Various computer-implemented algorithms can be used to process data received from a light sensor comprising disclosed polarization sensitive focal plane arrays. One type of algorithm calculates depth information with a fringe analysis method to unwrap the phase of the projected fringe. Another type of algorithm utilizes a physics based model, such as Fresnel equations and Mueller matrix formalism, to determine the material properties, such as refractive index and bidirectional reflectance distribution function, and surface normal. For certain exemplary wavelength ranges, such as far infrared, it is also possible to calculate the surface shape by measuring the Stokes parameters and degree of linear polarization (DOLP) of a black body.

In examples where more than one camera is used, stereo vision techniques can recover the 3D shape by a method of triangulation. In some examples, time-of-flight measurement can be used, with temporally modulated illumination and detection of the phase changes of the received light. In such examples, a high frame rate can be used to achieve high spatial resolution.

As will be readily understood by one of ordinary skill in the art the particular algorithms to implement can be adapted for a particular application, and can be selected based on one or more of a variety of factors, including but not limited to: computing power of the available hardware, speed of image acquisition, number of cameras used, desired precision in the 3D reconstruction, latency requirements of the application, the particular filtered optical signals detected, details of the structured light, types of objects in the scene, or any prior knowledge of these objects. In some examples, a simple algorithm with low computation overhead can be used for applications requiring fast reconstruction with medium to high accuracy.

Figure 11:
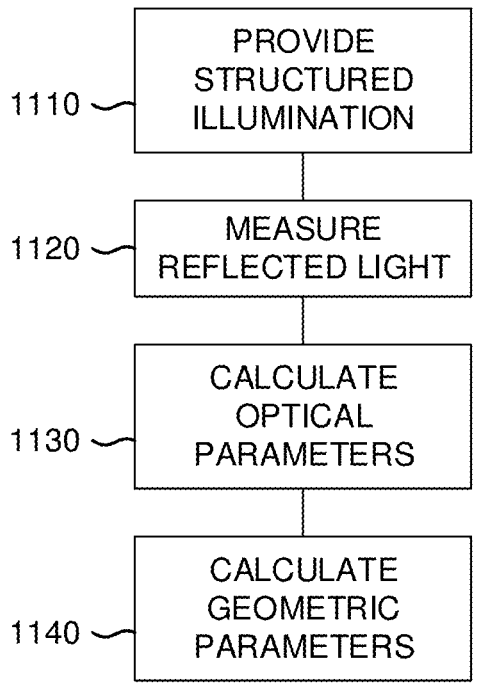
FIG. 11 is a flowchart depicting reconstruction according to an example.

FIG. 11 is a flowchart depicting an imaging and reconstruction procedure for an example similar to those described above in context of FIGS. 1, 2, and 6. At process block 1110, structured illumination is provided by a light source similar to light sources 102, 202, or 611. At process block 1120, light reflected or scattered from objects in a scene is detected by a camera similar to cameras 101, 201, 203, or 612. At process block 1130, optical parameters of the light (for example, Degree of Linear Polarization, or Stokes parameters) are calculated by a computer similar to that described in a computing environment 1400, described further below. At process block 1140, the geometric parameters are calculated by a computer similar to that described in the computing environment 1400. In various examples, process blocks 1130 and 1140 may be performed on the same or a different computer. These computers can be integrated with controllers similar to controllers 103, or 204, or can be integrated with an imager similar to imager 610.

V. Discrete or Point-source Emitters and Reflectors

A set of one or more reflectors or emitters can drastically improve the accuracy of the measurement. In some examples, measurement of reflected light from the objects in the scene, excluding the reflectors, can be used to provide starting estimates of the location, motion, and/or orientation of the objects, as described above. Measurements from reflectors or emitters can be used to provide additional information to refine the initial estimates. Depending on the shape and size of an object, the number of reflectors or emitters can be increased to improve the measurement accuracy.

Figure 7B:
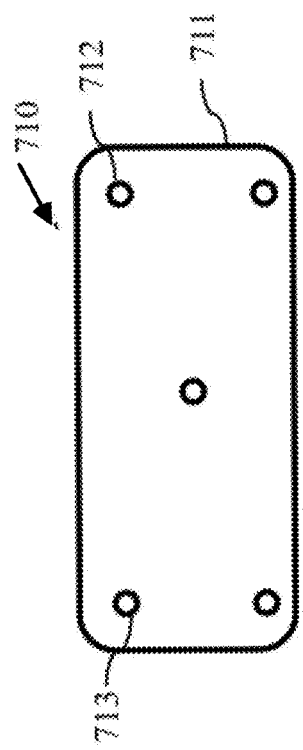
FIG. 7B depicts one facet of the goggle of FIG. 7A.
Figure 7A:
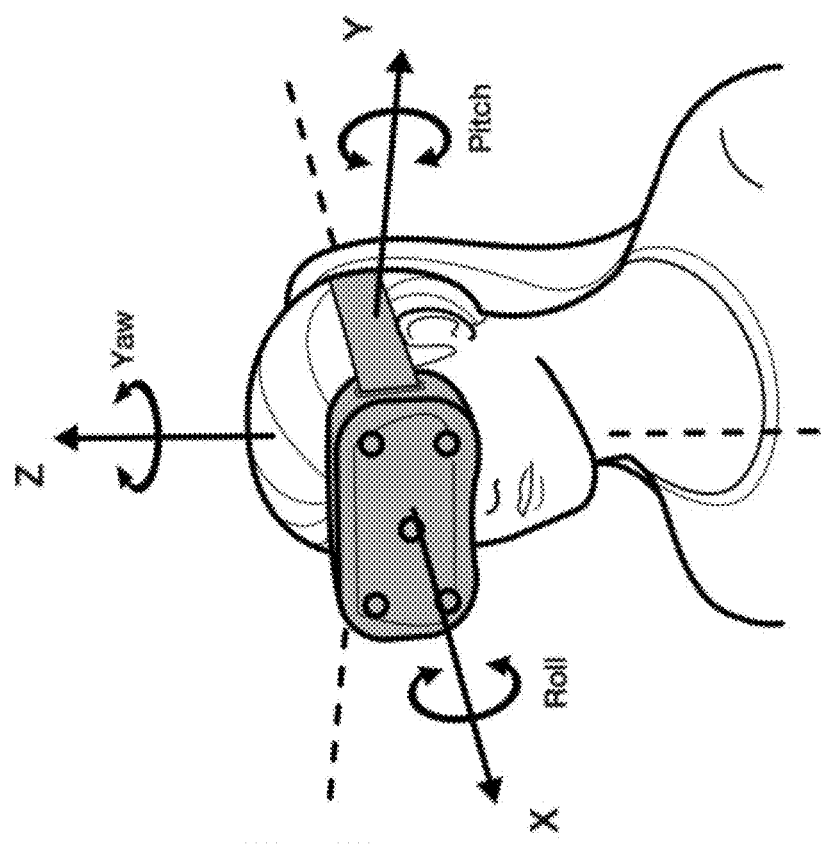
FIG. 7A depicts a goggle with reflectors and/or light sources, in use by a person.

The disclosed technologies can be applied to tracking of moving objects in real time, such as a person. The person can be wearing a goggle, an article of clothing or a glove for tracking of the head, the body, or a hand respectively. FIG. 7A depicts a goggle with reflectors and/or light sources, in use by a person. Also shown are three axes about which the goggles can rotate, leading to changes in orientation, which can be determined using the disclosed technologies. FIG. 7B depicts one facet 711 of the goggle 710, which has point reflectors or light sources, 712 and 713, mounted at different locations thereon.

In some examples, point reflectors can be placed at different locations of the goggle, clothing item, or glove. In some examples, the reflector can be small, having a size in a range of about 1 to 10 percent, about 0.1 to 1 percent, or even about 0.01 to 0.1% compared with the size of the goggle, clothing item, or glove to which it is attached. Motion can be determined by measurement of the locations of the reflectors. The point reflectors can reflect light of one color or polarization state, as determined by the illumination sources.

In some examples, the reflector can be illuminated by near infrared unpolarized light. The reflector can be a linear polarized reflector along a predefined direction. In such examples, the reflected infrared light is polarized along this direction. Measurement of the polarized light direction and location of different reflectors allows the determination of the surface normal of the plane or other surface on which the reflector is located. In other examples, each reflector may be replaced by a light source, such as a light emitting diode, with predefined color and polarization state(s). FIG. 8A depicts a light source 800 emitting light 801 over $2\pi$ a steradians. In some examples, each light source emits light of same color and polarization state in all directions. In other examples, the light source 800 can emit light of different colors and/or different polarization states in different directions 801. FIG. 8B depicts the polarization state of an exemplary light source having different polarization states for different angular positions. The light source can emit light of one color and nine different polarization states in nine different directions. 811 and 812 are two directions of different polarization. FIG. 8C depicts the wavelength of an exemplary light source having different colors for different angular positions. In such an example, the light source can emit light of one polarization state and nine different colors in nine different directions. 821 and 822 are two directions of different color. FIG. 8D depicts the polarization state and wavelength of an exemplary light source having different combinations of color and wavelength at different angular positions. In such an example, the light source can emit light of nine different combinations of colors and polarization states in nine different directions. One of ordinary skill in the art will readily appreciate that the number nine has been chosen in these examples purely for the purpose of illustration. In varying examples, the number of distinguished directions can be 10, 100, 1,000, 10,000, or even larger, or the number of distinguished directions can be as small as one. In these examples, there is a one-to-one map between the direction of the emitted light and the color and polarization state of the light. FIG. 8E depicts a map of light directions having different polarization eccentricity and angle over $2\pi$ a steradians. Each grid square represents a direction; the coordinates of the grid square indicate the ellipse eccentricity and angle of polarization for light emitted in that direction. Thus, knowing the ellipse eccentricity and angle of polarization allows unique determination of the direction of light emission in a reference frame of the light emitter. FIG. 8F depicts a map of light directions having different wavelength and polarization angle covering $2\pi$ steradians.

Each grid square represents a direction; the coordinates of the grid square indicate the wavelength and angle of polarization for light emitted in that direction. Thus, knowing the wavelength and angle of polarization allows unique determination of the direction of light emission in a reference frame of the light emitter.

Figure 9:
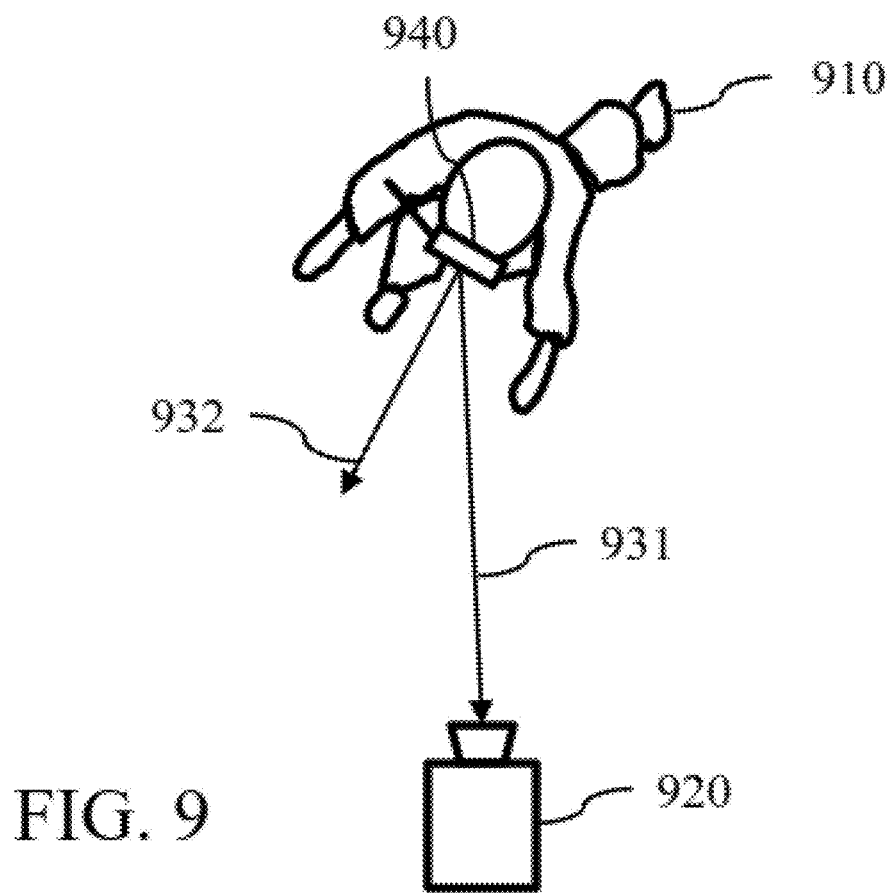
FIG. 9 depicts a user wearing a goggle and being imaged by a camera. Measurement of light sources on the goggle determines the location and surface normal of the goggle.

Such a light source can be placed on a goggle. FIG. 9 depicts a user 910 wearing a goggle 940 and being imaged by a camera 920. The measurement of the color and polarization state of the light 931 can determine the direction of the detected light in the reference frame of the light emitter or goggle 940, which is related to the surface normal 932 of the plane of the goggle where the light source is located. Measurement of light source(s) on the goggle determines the location and surface normal 932 of the goggle. As shown in this example, the disclosed technologies allow such determinations to be made using a single camera, unlike stereoscopic systems requiring two or more cameras.

Figure 10:
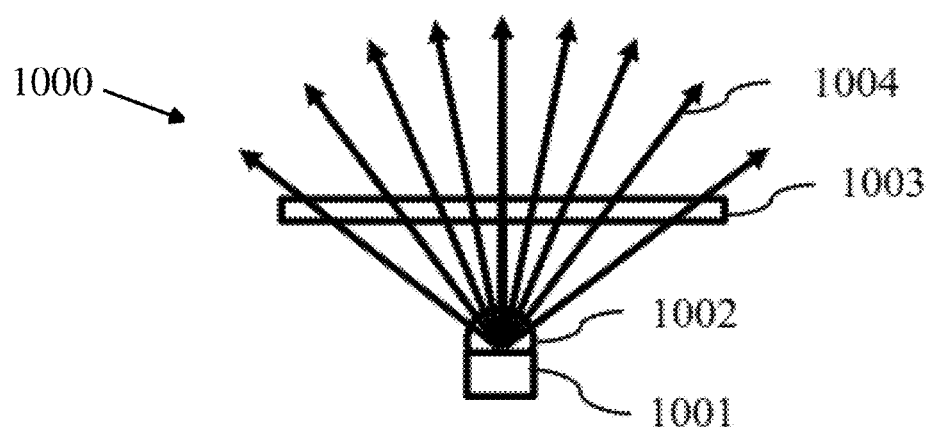
FIG. 10 depicts a spatially varying optical filter used to implement an exemplary light source emitting light of different polarization and/or different color in different directions.

FIG. 10 depicts a spatially varying optical filter 1003 used to implement a light source 1000 emitting light 1004 of different polarization states and/or different colors in different directions. Such a light source 1000 can be implemented by using a light emitting diode 1001, a lens 1002, and a spatially varying optical filter 1003. Light rays 1004 passing through optical filter 1003 have different color and/or polarization states, predetermined by the optical filter 1003 and the direction of emission. Light emitted by such a light source is a form of structured light.

Figure 12:
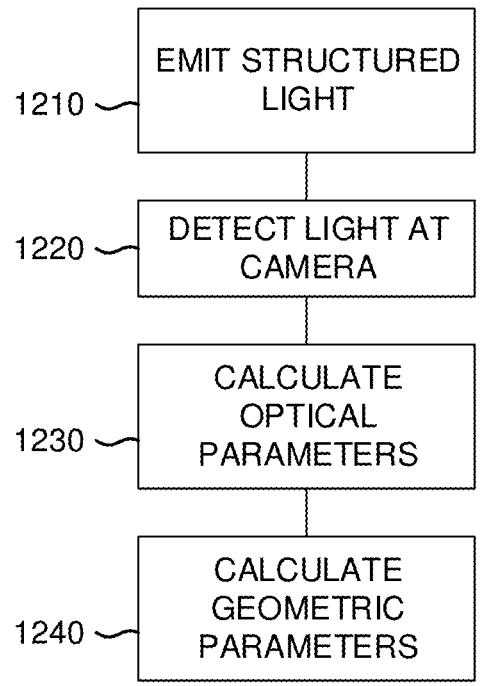
FIG. 12 is a flowchart depicting reconstruction according to an example.

FIG. 12 is a flowchart showing an imaging and reconstruction procedure for an example utilizing light emitters. At process block 1210 structured light is emitted by a light emitter similar to those described above in context of FIG. 8 or 10. At process block 1220, light from the light emitter is detected by a camera similar to camera 920. At process block 1230, optical parameters of the light (for example, Degree of Linear Polarization, or Stokes parameters) are calculated by a computer similar to computing environment 1400, described further below. At process block 1240, the geometric parameters are calculated by a computer similar to computing environment 1400. In various examples, process blocks 1230 and 1240 may be performed on the same or a different computer.

Figure 13:
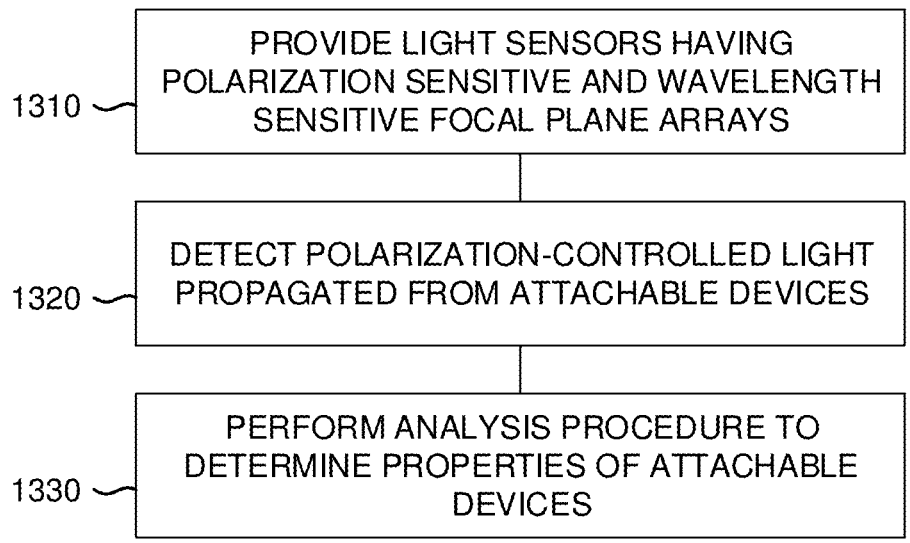
FIG. 13 is a flowchart depicting another example method.

FIG. 13 is a flowchart depicting another example method. At process block 1310, one or more light sensors are provided having respective polarization sensitive and wavelength sensitive focal plane arrays. At process block 1320, polarization-controlled light propagated from one or more attachable devices is detected at the light sensor(s). At process block 1330, an analysis procedure is performed at one or more computers to determine properties of the attachable devices. The properties can include one or more of: position, orientation, direction of a surface normal, speed, velocity, color, reflectance, refractive index, or bidirectional reflectance distribution.

VI. Example Applications

Imagers and systems according to the disclosed technologies can be used in a wide variety of applications, including virtual reality, augmented reality, gaming, industrial automation, navigation of autonomous vehicles and robots, and tele-surgery. Applications also include directing remote operation of a machine or instrument, for example by sensing a user's glove at a first location to operate a machine or instrument by matching hand motions at a second location. Applications also include controlling a directional flow of energy to, from, or to avoid a sensed object. Applications also include controlling directional movement of the sensed object in response to its position and orientation, and controlling directional movement of a second object in relation (for example: toward, or to avoid) the sensed object.

Imagers and systems according to the disclosed technologies can by paired so that objects sensed at a first location can be reproduced on a display at a second location and vice versa, thereby enabling a wide range of remote interactive applications. Such applications include gaming, healthcare, social activities, sports or athletics, and training. Multiple imagers and systems according to the disclosed technologies, up to five, ten, 100, 1,000 or even more can be similarly combined to create large-scale virtual worlds.

VII. Additional Examples of the Disclosed Technology

The following example features can be used individually or in any combination or subcombination with any of the examples described herein.

An example system includes one or more attachable devices having one or more discrete polarization-controlled components, each component including one or more of a light-emitting component or a reflective component. The example system further includes zero or more illumination sources configured to illuminate the one or more attachable devices, at least one light sensor incorporating a polarization sensitive focal plane array, and one or more computers connected to the light sensor.

An attachable device can be attached to one or more of: goggles, a helmet, a visor, a wearable device, a glove, a jacket, footwear, or a tag. An attachable device can be attached to one or more of: a vehicle, an autonomous vehicle, a civil structure, a light pole, a utility pole, a curb, a sidewalk, a building, a container, or a person. The number of discrete polarization-controlled components on at least one of the attachable devices can be one or more of: exactly one, exactly two, three to four, five to eight, nine to sixteen, seventeen to thirty-two, or thirty-three to one hundred.

In embodiments with light-emitting components, the light-emitting components can emit light having one or more of the following characteristics: polarization that is uniform for all angles of emission; polarization that varies across angles of emission in one angular direction; or polarization that varies across angles of emission in two angular directions. The variation in polarization can be variation in angle of polarization, or variation in ellipse eccentricity; the variation in polarization can be discretely stepped in one or more direction and/or can be continuously varied in one or more direction. The light-emitting components can emit light having color that is uniform for all angles of emission; color that varies across angles of emission in one angular direction; or color that varies across angles of emission in two angular directions. The color variation can be discretely stepped in one or more directions and/or can be continuously varied in one or more directions. A light-emitting component can incorporate a spatially varying optical filter.

In embodiments with reflective components, at least one attachable device incorporates a reflective component, and at least one reflective component can have one or more of: preferential reflectivity of one color; preferential reflectivity of one polarization state; reflectivity having controlled variation in one angular direction; or reflectivity having controlled variation in two angular directions. The system can further include one or more illumination sources. An illumination source can generate light which after reflection by a polarization-controlled reflective component, can be detected by a polarization sensitive focal plane array. The illumination source can be a structured illumination source and can be controlled by one or more computers.

In some embodiments, the number of light sensors is exactly one. A light sensor can be part of a camera. A light-sensor can be color-sensitive. An attachable device can incorporate a color-controlled component, which can be same as or different from a polarization-controlled component.

At least one of a system's computers can be configured to apply an analysis procedure to data obtained from the one or more light sensors to determine one or more properties of the one or more attachable devices. In various embodiments, the system can be configured to perform one or more of the following operations: generate a virtual reality display based on position and/or orientation of one or more of the attachable devices; generate position and/or orientation information of a first one of the light sensors based on observed position and/or orientation of one or more of the attachable devices as seen by the first light sensor; generate and store a record of the position and/or orientation of one or more of the attachable devices; or generate and store a record of the position and/or orientation of one or more of the computers.

Further, the system can be used to perform any one or more of the following acts: generating a virtual reality or augmented reality display; providing user input in a gaming environment; directing remote operation of a machine or instrument; navigating an autonomous vehicle; controlling a directional movement of an object; controlling a directional flow of energy; surveillance; or tele-surgery.

An analysis procedure can be applied to data obtained from the one or more light sensors of a disclosed system, to determine one or more properties of the one or more attachable devices. The analysis procedure can incorporate one or more of: fringe analysis, a physics-based model using Fresnel equations, a physics-based model using Mueller matrix formalism, analysis of degree of linear polarization using a black-body model, or stereoscopic analysis. The determined properties can include one or more of: position, orientation, direction of a surface normal, speed, velocity, color, reflectance, refractive index, or bidirectional reflectance distribution.

An example light sensor incorporates a polarization sensitive focal plane array having first pixels of a first repeating type, each of the first pixels comprising a block of subpixels. A first subpixel of the block includes a first polarization filter configured to transmit light of a first state of polarization and to substantially block light of a second state of polarization orthogonal to the first state, while a second subpixel of the block includes a second polarization filter configured to transmit light of a third state of polarization and to substantially block light of a fourth state of polarization orthogonal to the third state, the first and third states of polarization being different.

The block can include a third subpixel having a third polarization filter configured to transmit light of a fifth state of polarization and to block light of a sixth state of polarization orthogonal to the fifth state, the fifth state of polarization being different from both the first and third states. The block can include a fourth subpixel of having a fourth polarization filter configured to transmit light of a seventh state of polarization and to block light of a eighth state of polarization orthogonal to the seventh state, the seventh state of polarization being different from all of the first, third, and fifth states. The four polarization filters of a block with four subpixels can be organized in a variety of patterns, including those depicted in FIG. 4B, 4C, or 4E.

The first and third states of polarization can be linear. The fourth state can be the same as the first state. The second state can be the same as the third state. Similarly, the fifth and seventh states of polarization can be linear, and can be oriented at 45° to the first state of polarization. The eighth state can be the same as the fifth state. The sixth state can be the same as the seventh state.

The block can also include one or more of fifth, sixth, seventh, or eighth subpixels, each having a respective polarization filter configured to transmit light of a respective polarization state. These respective polarization states are all different from each other and also different from the first, third, fifth, and seventh polarization states. Each polarization filter can also substantially block light of a polarization state orthogonal to its respective (transmitted) polarization state.

Two among the transmitted states of polarization of a block's subpixels can be circular and opposite to each other. Two or four among the polarization filters can be elliptical polarizers each incorporating a vertical polarizer and a retarder having a retardance of about 132° and different fast axes angles selected from the group consisting of about −51.7°, about −15.1°, about +15.1°, and about +51.7°. At least one retarder can include a liquid crystal polymer. At least one polarization filter can include one or more of: a wire grid polarizer, a liquid crystal polymer polarizer, or a dichroic material.

The block can be organized as a 2×$N_1$ array of subpixels or as a 1×$N_1$ array of subpixels, and the blocks can be arranged so that their respective first subpixels form stripes.

A light sensor can also include second pixels of a second repeating type each pixel having a cluster of subpixels, wherein a first subpixel of the cluster transmits a first color and (a) can include a color filter configured to selectively transmit the first color, or (b) the first color is white and the first subpixel is a clear subpixel, and a second subpixel of the cluster can include a color filter configured to selectively transmit a second color, the first and second colors being different.

The cluster can include a third subpixel incorporating a color filter configured to selectively transmit a third color, different from both the first and second colors. The cluster can include a fourth subpixel having a color filter configured to selectively transmit a fourth color, different from all of the first, second, and third colors. The color filters of a cluster and the polarization filters of a block can be arranged in various patterns, such as those shown in FIG. 5A, 5B, or 5C.

The block can be organized as a 2×$N_2$ array of subpixels or as a 1×$N_2$ array of subpixels, and the clusters can be arranged so that their respective first subpixels form stripes. A cluster subpixel can incorporate can incorporate a block, that is, a subpixel of the second type of pixel can incorporate a pixel of the first type. Alternatively, a block subpixel can incorporate a cluster, that is, a subpixel of the first type of pixel can incorporate a pixel of the second type.

Further a first subpixel of the block can transmit the first color and (a) can include a color filter configured to selectively transmit the first color, or (b) the first color is white and the first subpixel is a clear subpixel, and a second subpixel of the cluster can include a color filter configured to selectively transmit the second color, the first and second colors being different. A third subpixel of the block can incorporate a color filter configured to selectively transmit the third color, different from both the first and second colors. A fourth subpixel of the block can have a color filter configured to selectively transmit the fourth color, different from all of the first, second, and third colors. Any one of the transmitted colors can be selected from red, green, blue, white, yellow, magenta, cyan, infrared, and ultraviolet.

The light sensor can incorporate a charge-coupled device (CCD) light sensor or a complementary metal oxide semiconductor (CMOS) light sensor.

An example system can include a structured illumination source, one or more cameras incorporating a disclosed light sensor, and one or more computers connected to the camera(s). The system can include exactly one camera. The structured illumination source can be coupled to one or more of the computers.

One or more of the computers can be configured to perform an analysis procedure on data obtained from the one or more cameras of a disclosed system, to determine one or more properties of one or more test objects illuminated by the structured illumination. The analysis procedure can incorporate one or more of: fringe analysis, a physics-based model using Fresnel equations, a physics-based model using Mueller matrix formalism, analysis of degree of linear polarization using a black-body model, or stereoscopic analysis. The determined properties can include one or more of: position, orientation, direction of a surface normal, speed, velocity, color, reflectance, refractive index, or bidirectional reflectance distribution.

An example apparatus for providing virtual interactivity can include a first disclosed system in a first location, and a second disclosed system in a second location, wherein the first and second systems are configured to generate position and/or orientation information of one or more objects at the first and second locations respectively, each object attached to at least one attachable device of the corresponding system. The apparatus also includes a first display at the first location configured to display objects at the second location, and a second display at the second location configured to display objects at the first location.

The apparatus can further include one or more additional disclosed systems in respective locations, wherein each additional system is configured to generate position and/or orientation information of one or more objects at the location of the additional system, and wherein the first display is configured to display objects at the location of each additional system. The apparatus can further include one or more additional displays in respective locations, each additional display being configured to display objects at the first location.

The apparatus can be used to provide one or more of: interactive gaming, interactive healthcare, interactive leisure or social activity, interactive sports or athletics, or interactive training.

VIII. Example Computing Environment

Figure 14:
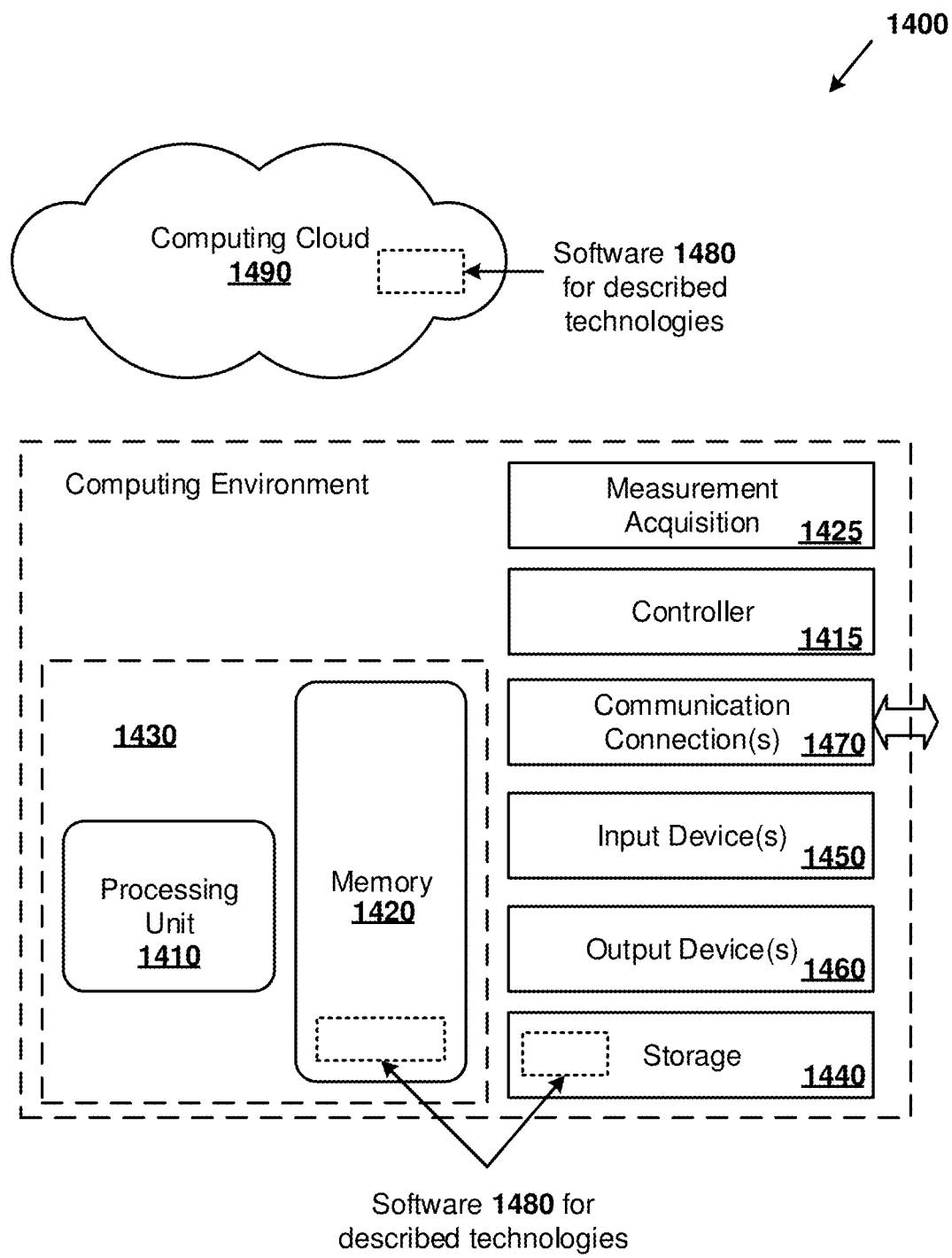
FIG. 14 illustrates a generalized example of a suitable computing environment in which described embodiments, techniques, and technologies, including image processing, 3-D reconstruction, and control of structured illumination can be implemented.

FIG. 14 illustrates a generalized example of a suitable computing environment 1400 in which described examples, techniques, and technologies, including enumeration of objects in a file system or a directory structure, can be implemented. For example, the computing environment 1400 can implement all of the functions described with respect to FIGS. 1-4, as described herein.

The computing environment 1400 is not intended to suggest any limitation as to scope of use or functionality of the technology, as the technology can be implemented in diverse general-purpose or special-purpose computing environments. For example, the disclosed technology can be implemented with other computer system configurations, including hand held devices, multiprocessor systems, microprocessor-based or programmable consumer electronics, network PCs, minicomputers, mainframe computers, and the like. The disclosed technology can also be practiced in distributed computing environments where tasks are performed by remote processing devices that are linked through a communications network. In a distributed computing environment, program modules can be located in both local and remote memory storage devices.

With reference to FIG. 14, the computing environment 1400 includes at least one central processing unit 1410 and memory 1420. In FIG. 14, this most basic configuration 1430 is included within a dashed line. The central processing unit 1410 executes computer-executable instructions and can be a real or a virtual processor. In a multi-processing system, multiple processing units execute computer-executable instructions to increase processing power and as such, multiple processors can be running simultaneously. The memory 1420 can be volatile memory (e.g., registers, cache, RAM), non-volatile memory (e.g., ROM, EEPROM, flash memory, etc.), or some combination of the two. The memory 1420 stores software 1480, images, and video that can, for example, implement the technologies described herein. A computing environment can have additional features. For example, the computing environment 1400 includes storage 1440, one or more input devices 1450, one or more output devices 1460, and one or more communication connections 1470. Measurement acquisition subsystem 1425 provides interfaces to which cameras can be connected. Controller 1415 provides interfaces to which structured illumination sources can be connected.

An interconnection mechanism (not shown) such as a bus, a controller, or a network, interconnects the components of the computing environment 1400. Typically, operating system software (not shown) provides an operating environment for other software executing in the computing environment 1400, and coordinates activities of the components of the computing environment 1400.

The storage 1440 can be removable or non-removable, and includes magnetic disks, magnetic tapes or cassettes, CD-ROMs, CD-RWs, DVDs, or any other medium which can be used to store information and that can be accessed within the computing environment 1400. The storage 1440 stores instructions for the software 1480 and measurement data, which can implement technologies described herein.

The input device(s) 1450 can be a touch input device, such as a keyboard, keypad, mouse, touch screen display, pen, or trackball, a voice input device, a scanning device, or another device, that provides input to the computing environment 1400. The input device(s) 1450 can also include interface hardware for connecting the computing environment to control and receive data from host and client computers, storage systems, measurement acquisition components, control excitation sources, or to display or output data processed according to methods disclosed herein, including data acquisition systems coupled to a plurality of sensors.

For audio, the input device(s) 1450 can be a sound card or similar device that accepts audio input in analog or digital form, or a CD-ROM reader that provides audio samples to the computing environment 1400. The output device(s) 1460 can be a display, printer, speaker, CD-writer, or another device that provides output from the computing environment 1400.

The communication connection(s) 1470 enable communication over a communication medium (e.g., a connecting network) to another computing entity. The communication medium conveys information such as computer-executable instructions, compressed graphics information, video, or other data in a modulated data signal.

Some examples of the disclosed methods can be performed using computer-executable instructions implementing all or a portion of the disclosed technology in a computing cloud 1490. For example, collection of measurement data can be executed in the computing environment (e.g., by the measurement acquisition component 1425), while analysis of the measurement data can be performed on remote servers located in the computing cloud 1490.

Computer-readable media are any available media that can be accessed within a computing environment 1400. By way of example, and not limitation, with the computing environment 1400, computer-readable media include memory 1420 and/or storage 1440. As should be readily understood, the term computer-readable storage media includes the media for data storage such as memory 1420 and storage 1440, and not transmission media such as modulated data signals.

IX. General Considerations

As used in this application the singular forms "a," "an," and "the" include the plural forms unless the context clearly dictates otherwise. Additionally, the term "includes" means "comprises." Further, the term "coupled" encompasses mechanical, electrical, magnetic, optical, as well as other practical ways of coupling or linking items together, and does not exclude the presence of intermediate components between the coupled items. Furthermore, as used herein, the term "and/or" means any one item or combination of items in the phrase.

The systems, methods, and apparatus described herein should not be construed as being limiting in any way. Instead, this disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed things and methods require that any one or more specific advantages be present or problems be solved. Furthermore, any features or aspects of the disclosed embodiments can be used in various combinations and subcombinations with one another.

Although the operations of some of the disclosed methods are described in a particular, sequential order for convenient presentation, it should be understood that this manner of description encompasses rearrangement, unless a particular ordering is required by specific language set forth below. For example, operations described sequentially can in some cases be rearranged or performed concurrently. Moreover, for the sake of simplicity, the attached figures may not show the various ways in which the disclosed things and methods can be used in conjunction with other things and methods. Additionally, the description sometimes uses terms like "produce," "generate," "display," "apply," "estimate," "analyze," and "determine" to describe the disclosed methods. These terms are high-level abstractions of the actual operations that are performed. The actual operations that correspond to these terms will vary depending on the particular implementation and are readily discernible by one of ordinary skill in the art.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Some of the disclosed methods can be implemented using computer-executable instructions stored on one or more computer-readable media (e.g., non-transitory computer-readable media, such as one or more optical media discs, volatile memory components (such as DRAM or SRAM), or nonvolatile memory components (such as flash drives or hard drives)) and executed on a computer (e.g., any commercially available computer, including smart phones or other mobile devices that include computing hardware). Any of the computer-executable instructions for implementing the disclosed techniques, as well as any data created and used during implementation of the disclosed embodiments, can be stored on one or more computer-readable media (e.g., non-transitory computer-readable media). The computer-executable instructions can be part of, for example, a dedicated software application, or a software application that is accessed or downloaded via a web browser or other software application (such as a remote computing application). Such software can be executed, for example, on a single local computer (e.g., as a process executing on any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C, C++, Common Lisp, Dylan, Erlang, Fortran, Go, Haskell, Java, Julia, Python, Scheme, or any other suitable programming language. Likewise, the disclosed technology is not limited to any particular computer or type of hardware. Certain details of suitable computers and hardware are well-known and need not be set forth in detail in this disclosure.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

In view of the many possible embodiments to which the principles of the disclosed subject matter may be applied, it should be recognized that the illustrated embodiments are only preferred examples and should not be taken as limiting the scope of the claims to those preferred examples. Rather, the scope of the claimed subject matter is defined by the following claims. I therefore claim as my invention all that comes within the scope of these claims.

I claim:

1. A system for tracking one or more moving objects having one or more devices attached thereto, the system comprising:
    the one or more devices, each comprising one or more polarization-controlled components, each polarization-controlled component comprising one or more light-emitting components;
    one or more light sensors comprising a respective polarization sensitive and wavelength sensitive focal plane array and situated to receive respective portions of light emitted by the light-emitting components; and
    one or more computers coupled to the light sensor(s) and configured to analyze wavelength and polarization of the portions of light received by the light sensor(s) to determine position and orientation of the one or more devices.

2. The system of claim 1, wherein the light-emitting components have polarization that is uniform for all angles of emission.

3. The system of claim 1, wherein the light-emitting components have polarization that varies across angles of emission.

4. The system of claim 1, wherein at least one light-emitting component comprises a spatially varying optical filter transmitting light of different polarization and/or different color in different directions.

5. The system of claim 1, further comprising the moving objects to which the one or more devices are attached, wherein the moving objects are one or more of: goggles, a helmet, a visor, a headband, a glove, a vest, a jacket, a wristband, an armband, an anklet, a legging, footwear, or an adhesive tag.

6. The system of claim 1, wherein the system is configured to provide
    user input in a gaming environment.

7. The system of claim 1, wherein the system is configured to generate and store a record of the orientation of the devices.

8. The system of claim 1, wherein the light-emitting components emit light at one or more wavelengths including a first wavelength that is detected by the light sensors, and wherein the first wavelength is in an infrared spectral range or an ultraviolet spectral range.

9. An apparatus for providing virtual interactivity, comprising:
    a first system according to claim 1 in a first location;
    a second system according to claim 1 in a second location,
        wherein the first and second systems are configured to generate position and orientation information of the respective one or more objects at the first and second location, based on the determined position and orientation of the respective one or more devices;

a first display at the first location configured to display objects at the second location; and a second display at the second location configured to display objects at the first location.

10. The apparatus of claim 9, further comprising:

one or more additional systems according to claim 1 in respective locations;

wherein each additional system is configured to generate position and orientation information of the respective one or more objects at the location of the additional system; and wherein the first display is configured to display the respective one or more objects at the location of each additional system.

11. A method, comprising:

providing a system according to claim 1;

at the light sensor(s), detecting polarization-controlled light propagated from the one or more devices; and at one or more computers, performing an analysis procedure to determine one or more additional properties of the one or more devices;

wherein the additional properties are one or more of: direction of a surface normal, speed, velocity, color, reflectance, refractive index, or bidirectional reflectance distribution.

12. The method of claim 11, wherein the analysis procedure comprises a physics-based procedure using Fresnel equations or a physics-based procedure using Mueller matrix formalism.

13. The system of claim 1, wherein the polarization sensitive and wavelength sensitive focal plane array comprises first pixels of a first repeating type and second pixels of a second repeating type, wherein:

each of the first pixels comprises a block of subpixels, wherein:

a first subpixel of the block comprises a first polarization filter configured to transmit light of a first state of polarization and to substantially block light of a second state of polarization orthogonal to the first state, a second subpixel of the block comprises a second polarization filter configured to transmit light of a third state of polarization and to substantially block light of a fourth state of polarization orthogonal to the third state, and the first and third states of polarization are different; and each of the second pixels comprises a cluster of subpixels, wherein:

a first subpixel of the cluster transmits a first wavelength and comprises a wavelength filter configured to selectively transmit the first wavelength, a second subpixel of the cluster comprises a wavelength filter configured to selectively transmit a second wavelength, and the first and second wavelengths are different.

14. The light sensor of claim 13, wherein at least one of the subpixels of the block comprises a liquid crystal polymer retarder.

15. The light sensor of claim 13, wherein at least one of the polarization filters comprises one or more of: a wire grid polarizer, a liquid crystal polymer polarizer, or a dichroic material.

16. The system of claim 1, wherein at least one of the polarization-controlled components has a wavelength of emission that varies across angles of emission.

17. The system of claim 1, wherein at least one of the polarization-controlled components has a wavelength of emission that is uniform for all angles of emission.

18. The system of claim 1, wherein the polarization sensitive and wavelength sensitive focal plane array is configured to discriminate two or more states of elliptical or circular polarization.

19. The system of claim 1, wherein the system is configured to control directional movement of a given object.

20. The system of claim 1, wherein the system is configured to provide a virtual reality display.

21. The system of claim 1, wherein two or more of the devices are attached to a same one of the moving objects.

22. The system of claim 1, wherein the light sensors comprise at least two distinct light sensors both receiving the respective portions of light emitted by the one or more light-emitting components of a given one of the devices.

23. A method comprising:

emitting polarization-controlled light from one or more movable devices;

receiving respective portions of the emitted polarization-controlled light at one or more polarization-sensitive and wavelength-sensitive focal plane arrays; and at one or more computers:

analyzing wavelength and polarization of the received light to determine position and orientation of the movable devices; and generating a virtual reality or augmented reality display based on the determined position and orientation of the movable devices.

24. A system for tracking one or more moving objects having one or more devices attached thereto, the system comprising:

the one or more devices, each comprising one or more polarization-controlled components, each polarization-controlled component comprising one or more light-emitting components, at least one of the light-emitting components transmitting light with polarization varying along a first angular coordinate and color varying along a second angular coordinate different from the first angular coordinate;

one or more light sensors comprising a respective polarization sensitive and wavelength sensitive focal plane array and situated to receive respective portions of light emitted by the light-emitting components; and one or more computers coupled to the light sensor(s) and configured to analyze wavelength and polarization of the portions of light received by the light sensor(s) to determine position and orientation of the one or more devices.

* * * * *